(12) United States Patent
Sato et al.

(10) Patent No.: US 6,855,634 B2
(45) Date of Patent: Feb. 15, 2005

(54) POLISHING METHOD AND POLISHING APPARATUS

(75) Inventors: Shuzo Sato, Kanagawa (JP); Yuji Segawa, Tokyo (JP); Akira Yoshio, Tokyo (JP); Takeshi Nogami, Kanagawa (JP)

(73) Assignee: Sony Corporation, Tokyo (JP)

( * ) Notice: Subject to any disclaimer, the term of this patent is extended or adjusted under 35 U.S.C. 154(b) by 247 days.

(21) Appl. No.: 09/963,966

(22) Filed: Sep. 26, 2001

(65) Prior Publication Data

US 2002/0072309 A1 Jun. 13, 2002

(30) Foreign Application Priority Data

Sep. 27, 2000 (JP) .................................... P2000-294974

(51) Int. Cl.⁷ .......................................... H01L 21/302
(52) U.S. Cl. ....................... 438/692; 438/695; 438/697; 438/699; 438/700
(58) Field of Search ................................ 438/692, 695, 438/697, 699, 700

(56) References Cited

U.S. PATENT DOCUMENTS 5,911,619 A * 6/1999 Uzoh et al. ..................... 451/5
6,066,030 A * 5/2000 Uzoh ............................ 451/41
6,096,652 A * 8/2000 Watts et al. ................. 438/692

* cited by examiner

Primary Examiner—Nadine G. Norton
Assistant Examiner—Binh X. Tran
(74) Attorney, Agent, or Firm—Robert J. Depke; Holland & Knight LLP

(57) ABSTRACT

A polishing method able to easily flatten unevenness formed on the surface of a film to be polished and able to efficiently polish the film flat while suppressing damage to an interlayer insulating film below the film, comprising, when polishing an object having a film such as an interconnection layer formed burying interconnection grooves formed in an insulating film of a substrate, supplying a polishing solution over the surface to be polished at least substantially parallel to the surface to preferentially remove by polishing the projecting portions of the film and flatten the surface by the shear stress of the processing solution or arranging a cathode member facing the surface and supplying an electrolytic solution containing a chelating agent between the surface and cathode member while supplying voltage between the film and the cathode member to preferentially remove by polishing the projecting portions of the film and flatten the surface by the shear stress of the electrolytic solution, and a polishing apparatus using the same.

14 Claims, 18 Drawing Sheets

POLISHING METHOD AND POLISHING APPARATUS

RELATED APPLICATION DATA

The present application claims priority to Japanese Application(s) No(s). P2000-294974 filed Sep. 27, 2000, which application(s) is/are incorporated herein by reference to the extent permitted by law.

BACKGROUND OF THE INVENTION

1. Field of the Invention

The present invention relates to a polishing method and polishing apparatus, a more particularly relates to a polishing method and polishing apparatus for flattening an uneven surface formed along with formation of copper interconnections in the process of production of a semiconductor device having copper interconnections.

2. Description of the Related Art

Along with the increase in integration and reduction of size of semiconductor devices, progress has been made in miniaturization of interconnections, reduction of interconnection pitch, and superposition of interconnections. The importance of the multilayer interconnection technology in the manufacturing process of semiconductor devices is therefore rising.

To form the interconnections of a semiconductor device of a multilayer interconnection structure, frequent use has been made of the method of forming the interconnections by aluminum or an alloy of the same, covering them by an insulating film, then burying contact holes passing through this insulating film by tungsten or an alloy of the same to connect with the lower interconnections.

With the above method, step differences arise due to the interconnections on the surface of the covering insulating film after the formation of the interconnections. Along with the miniaturization of interconnections, since the depth of focus at the photolithography of the upper layer can no longer be sufficiently matched with, a need has arisen for flattening these step differences. The method has been employed of polishing the insulating film by chemical mechanical polishing (CMP) method.

Further, use has been made of the metal CMP method of burying through holes formed in the insulating film by the above tungsten or other metal, removing the excess metal film by CMP, and thereby connecting with the lower interconnections.

On the other hand, in order to suppress the propagation delay of signals in the recent 0.25 $\mu$m or less design rule, an interconnection process for replacing the aluminum of the interconnection material by copper is being developed. When using copper for interconnections, there is the merit that both a low resistance and a high electromigration tolerance can be obtained.

In a process using this copper for interconnections, for example, an interconnection process referred to as the damascene process for burying a metal in groove-like interconnection patterns formed in an interlayer insulating film in advance and removing excess metal film by CMP to form the interconnections has become dominant.

The damascene process has the characteristics that etching of the interconnections become unnecessary and also a further upper interlayer insulating film becomes flat by itself, so the process can be simplified.

Further, by the dual damascene process where not only grooves for the interconnections, but also the contact holes are formed as grooves in the interlayer insulating film and where the interconnections and the contact holes are simultaneously buried by the metal, a greater reduction of the interconnection steps becomes possible.

Here, an explanation will be made of an example of the process for forming copper interconnections by the dual damascene process by referring to the figures below.

First, as shown in FIG. 11A, for example, an interlayer insulating film 302 made of for example silicon oxide is formed by for example low pressure chemical vapor deposition (CVD) on a silicon or other semiconductor substrate 301 on which a not illustrated impurity diffusion region is appropriately formed.

Next, as shown in FIG. 11B, contact holes CH communicating with the impurity diffusion region of the semiconductor substrate 301 and grooves M in which will be formed a predetermined pattern of interconnections to be electrically connected to the impurity diffusion region of the substrate 301 are formed by using well-known photolithography and etching.

Next, as shown in FIG. 11C, a barrier metal film 305 is formed on the surface of the interlayer insulating film 302 and in the contact holes CH and the grooves M. This barrier metal film 305 is formed by a material such as Ta, Ti, TaN, or TiN by well-known sputtering. When the interconnection material is copper and the interlayer insulating film 302 is silicon oxide, since copper has a large diffusion coefficient with respect to silicon oxide, it is easily oxidized. The barrier metal film 305 is provided to prevent this.

Next, as shown in FIG. 11D, a seed film 306 is formed on the barrier metal film 305 by depositing copper to a predetermined thickness by well-known sputtering.

Then, as shown in FIG. 11E, a copper film 307 is grown and formed on the seed film 306 so as to bury the contact holes CH and the grooves M by copper. The copper film 307 is formed by for example plating, CVD, sputtering, etc.

Next, as shown in FIG. 11F, the excess copper film 307 and barrier metal film 305 on the interlayer insulating film 302 are removed by CMP for flattening.

Due to the above steps, copper interconnections 308 and contacts 309 are formed.

By repeating the above process on the interconnections 308, multilayer interconnections can be formed.

Summarizing the problems to be solved by the invention, in the step of removing the excess copper film 307 by CMP in the copper interconnection forming process using the dual damascene process, because the flattening technique employing conventional CMP involves applying a predetermined pressure between a polishing tool and the copper film for polishing, there arises a problem that large damage is given to the semiconductor substrate. Especially, in a case where an insulating film of a small dielectric constant having a low mechanical strength, which will be important in the 0.13 $\mu$m generation and on, is used, the aforesaid damage is no longer negligible and may cause cracks of the interlayer insulating film and separation of the interlayer insulating film from the semiconductor substrate.

Further, the removal performance differs among the interlayer insulating film 302, the copper film 307, and the barrier metal film 305, therefore there has been the problem that dishing, erosion (thinning), recess, etc. easily occur in the interconnections 308.

Dishing is a phenomenon where, as shown in FIG. 12, when there is an interconnection 308 having a width of, for example, about 100 $\mu$m at a 0.18 $\mu$m design rule, the center portion of the interconnection is excessively removed and sinks. If this dishing occurs, the sectional area of the interconnection 308 becomes insufficient. This causes poor interconnection resistance etc. This dishing is apt to occur when copper or aluminum, which are relatively soft, is used as the interconnection material.

Erosion is a phenomenon where, as shown in FIG. 13, a portion having a high pattern density such as where interconnections with a width of 1.0 $\mu$m are formed at a density of 50% in a range of for example 3000 $\mu$m is excessively removed. When erosion occurs, the sectional area of the interconnections becomes insufficient. This causes poor interconnection resistance etc.

Recess is a phenomenon where, as shown in FIG. 14, the interconnection 308 becomes lower in level at the interface between the interlayer insulating film 302 and the interconnection 308 resulting in a step difference. In this case as well, the sectional area of the interconnection becomes insufficient, causing poor interconnection resistance etc.

Further, in the step of flattening and removing the excess copper film 307 by CMP, it is necessary to efficiently remove the copper film. The amount removed per unit time, that is, the polishing rate, is required to be for example more than 500 nm/min.

In order to obtain this polishing rate, it is necessary to increase the polishing pressure on the wafer. When the polishing pressure is raised, as shown in FIG. 15, a scratch SC and chemical damage CD are apt to occur in the interconnection surface. In particular, they easily occur in soft copper. For this reason, they cause opening of the interconnections, short-circuiting, poor interconnection resistance, and other defects. Further, if the polishing pressure is raised, there is the inconvenience that the amount of the scratches, separation of interlayer insulating film, dishing, erosion, and recesses also becomes larger.

SUMMARY OF THE INVENTION

An object of the present invention is to provide a polishing method and a polishing apparatus capable of easily flattening unevenness formed on the surface of a film and able to efficiently polish the film flat while suppressing damage to an interlayer insulating film below a copper film when flattening the copper film or other film by polishing to form copper interconnections etc. in a semiconductor device.

To achieve the above object, according to a first aspect of the present invention, there is provided a polishing method for polishing a film of an object to be polished having a substrate, an insulating film formed in the substrate, interconnection grooves formed in the insulating film, and said film, that is, an interconnection layer, formed inside and outside of the interconnection grooves comprising supplying a processing solution over the surface to be polished at least substantially parallel to that surface and removing by polishing the film formed outside of the interconnection grooves by a shear stress due to the processing solution preferentially from projecting portions of the film to flatten the surface.

According to the polishing method of the present invention, when flattening a copper film or other film by polishing to form copper interconnections in a semiconductor device, the processing solution is supplied over the surface to be polished substantially parallel to that surface.

When the processing solution is supplied over the surface to be polished substantially parallel to that surface, the large kinetic energy processing solution directly strikes the side surfaces of projecting portions of any unevenness on the surface. On the other hand, the processing solution remains still in the recessed portions. The kinetic energy of the processing solution there is small. Further, the amount of the processing solution in contact and acting there itself is small. Therefore, the shear stress of the processing solution acts so that the projecting portions are processed faster than the recessed portions. The initial unevenness can therefore be easily flattened.

Further, due to the above action of the processing solution, the film can be polished efficiently while maintaining the flatness.

Further, since no strong pressure is applied to the surface as in chemical mechanical polishing, polishing is possible while suppressing the damage to the interlayer insulating film etc. below the film to be polished.

Preferably, the film comprises a copper film.

That is, the polishing method of the present invention is suitable as a method of polishing a copper film which had been processed by CMP in the conventional damascene process etc.

Preferably, the object to be polished is made an object having contact holes communicating with the interconnection grooves formed in the insulating film and having the interconnection layer formed buried inside the contact holes as well.

That is, the polishing method of the present invention is suitable as a method of polishing a copper film or other film which had been processed by CMP in a dual damascene process for forming contact plugs at the same time as interconnections in contact holes communicating with the interconnection grooves.

Preferably, the polishing method further comprises using a processing solution containing at least a chelating agent as the processing solution; chelating the surface part of the film by the chelating agent to form a chelate film; removing by polishing preferentially projecting portions of the chelate film by the shear stress of the processing solution; and repeatedly again forming a chelate film on the surface parts of the film exposed at the projecting portions and removing by polishing preferentially the projecting portions of the chelate film to flatten the film.

That is, the surface of the film is chelated by reacting with the chelating agent supplied as the processing solution whereby an easily removable low mechanical strength chelate film is formed. By supplying the processing solution over the surface formed with this chelate film so as to be substantially parallel to that surface, the large kinetic energy processing solution directly strikes the side surfaces of the projecting portions of any unevenness on the surface, whereby the chelate film at the projecting portions is easily and preferentially removed by polishing. New surfaces for polishing are exposed at the projecting portions from which the surface chelate film had been removed. These exposed surfaces are chelated again and struck by the processing solution to be preferentially removed by polishing. The film can therefore be flattened by repetition of this action.

More preferably, the polishing method further comprises using a polishing solution further including an oxidizing agent as the polishing solution and oxidizing the surface part of the film by the oxidizing agent and chelating the obtained oxide by the chelating agent to form a chelate film.

That is, the surface of the film to be polished is oxidized by reaction with the oxidizing agent. The oxidized surface of the film is then chelated by reaction with the chelating agent.

Alternatively, preferably the polishing method further comprises using a polishing solution further including a surface-active agent as the polishing solution and removing the chelate as micelles covered by the surface-active agent when removing by polishing from projecting portions of the chelate film by the shear stress by the processing solution.

If a surface-active agent is added to the processing solution in this way, the chelate film formed on the surface to be polished is converted to micelles by the surface-active agent. These micelles are not bound by any bonding force to the lower film and are merely precipitated and deposited there by their own weight, so can be easily removed by the processing solution flowing substantially parallel to the surface.

To achieve the above object, according to a second aspect of the present invention, there is provided a polishing method for an object having a film on a surface to be polished, comprising supplying an electrolytic solution at least between the surface to be polished and a cathode member arranged facing the surface and substantially parallel to the surface while supplying voltage with the cathode member as a cathode and the film as an anode to remove by polishing preferentially projecting portions of the film by the shear stress of the electrolytic solution to flatten the surface.

According to the polishing method of the present invention, when flattening an object having a film on the surface to be polished, the cathode member is arranged facing that surface and the electrolytic solution is supplied over that surface substantially parallel to that surface.

When voltage is supplied with the cathode member as a cathode and the film as an anode, the surface of the film is electrolytically eluted. Alternatively, when the electrolytic solution includes a chelating agent, due to this application of voltage, the surface of the film is anodically oxidized and is chelated by the chelating agent. At this time, since the electrolytic solution flows over the surface substantially parallel to the surface, a shear stress of the electrolytic solution acts to promote the electrolytic elution or removal of the chelate film. Due to this, the initial unevenness can be easily flattened. Further, the film can be polished efficiently while maintaining the flatness.

Further, since no strong pressure is applied to the surface as in chemical mechanical polishing, polishing is possible while suppressing the damage to the interlayer insulating film etc. below the film to be polished.

Preferably, the film comprises a copper film.

That is, the polishing method of the present invention is suitable as a method of polishing a copper film which had been processed by CMP in the conventional damascene process etc.

Preferably, the polishing method further comprises using as the object to be polished an object having a substrate, an insulating film formed on the substrate, interconnection grooves formed on the insulating film, and said film, that is, an interconnection layer, buried inside the interconnection grooves and formed over the entire surface outside the interconnection grooves, and removing by polishing the film, that is, interconnection layer, formed outside of the interconnection grooves to flatten the surface.

More preferably, the object to be polished is made an object having contact holes communicating with the interconnection grooves formed in the insulating film and having the interconnection layer formed buried inside the contact holes as well.

That is, the polishing method of the present invention is suitable as a method of polishing a copper film or other film which had been processed by CMP in a dual damascene process for forming contact plugs at the same time as interconnections in contact holes communicating with the interconnection grooves.

Alternatively, preferably, the polishing method further comprises using an electrolytic solution containing at least a chelating agent as the electrolytic solution; supplying a voltage with the cathode member as a cathode and the film as an anode to oxidize the surface of the film by anodic oxidation; chelating the surface part of the oxidized film by the chelating agent to form a chelate film; removing by polishing preferentially projecting portions of the chelate film by the shear stress of the electrolytic solution; and repeatedly again forming a chelate film on the surface parts of the film exposed at the projecting portions and removing by polishing preferentially the projecting portions of the chelate film to flatten the interconnection layer.

Due to this, the oxidized surface of the film by anodic oxidation is chelated by reacting with the chelating agent supplied as the electrolytic solution whereby an easily removable low mechanical strength chelate film is formed. By supplying the electrolytic solution over the surface formed with this chelate film so as to be substantially parallel to that surface, the large kinetic energy electrolytic solution directly strikes the side surfaces of the projecting portions of any unevenness on the surface, whereby the chelate film at the projecting portions is easily and preferentially removed by polishing. New surfaces for polishing are exposed at the projecting portions from which the surface chelate film had been removed.

At this time, since the electrical resistance of the chelate film is far higher than that of the copper or other film, the film covered by the chelate film at the recessed portions remaining without being removed is inhibited from being anodically oxidized by the conductance. New chelate film is formed by anodic oxidation only at the projecting portions of the surface exposed by the removal of the chelate film.

Further, in the anodic oxidation, the shorter the distance between the cathode member and the film, the higher the current density, so even among the surfaces exposed by removal of the chelate film, the ones of the parts projecting out more have a larger current density and a faster speed of anodic oxidation so are accelerated in chelation.

By repeating this preferential removal of the projecting portions by the formation of a chelate film and striking action of the electrolytic solution with the chelate film, it is possible to flatten the film to be polished.

More preferably, the polishing method further comprises using an electrolytic solution further including a surface-active agent as the electrolytic solution and removing the chelate as micelles covered by the surface-active agent when removing by polishing from projecting portions of the chelate film by the shear stress by the electrolytic solution.

If a surface-active agent is added to the electrolytic solution in this way, the chelate film formed on the surface to be polished is converted to micelles by the surface-active agent. These micelles can be easily removed by the electrolytic solution flowing substantially parallel to the surface.

To achieve the above object, according to a third aspect of the present invention, there is provided a polishing apparatus for polishing an object having a film on a surface to be polished, comprising a processing solution supplying means for supplying a processing solution over the surface to be polished at least substantially parallel to that surface and removing by polishing the film formed outside of the interconnection grooves by a shear stress due to the processing solution preferentially from projecting portions of the film to flatten the surface.

When flattening the copper film or other film by polishing to form copper interconnections in a semiconductor device, the apparatus supplies the processing solution over the surface to be polished substantially parallel to that surface. The large kinetic energy processing solution directly strikes the side surfaces of projecting portions of any unevenness on the surface. On the other hand, the processing solution remains still in the recessed portions. The kinetic energy of the processing solution there is small. Further, the amount of the processing solution in contact and acting there itself is small. Therefore, the shear stress of the processing solution acts so that the projecting portions are processed faster than the recessed portions. The initial unevenness can therefore be easily flattened.

Further, due to the above action of the processing solution, the film can be polished efficiently while maintaining the flatness.

Further, since no strong pressure is applied to the surface as in chemical mechanical polishing, polishing is possible while suppressing the damage to the interlayer insulating film etc. below the film to be polished.

Preferably, the polishing apparatus polishes an object wherein the film comprises a copper film.

That is, the polishing apparatus of the present invention is suitable as an apparatus for polishing a copper film which had been processed by CMP in the conventional damascene process etc.

Preferably, the polishing apparatus supplies a processing solution containing at least a chelating agent from the processing solution supplying means.

More preferably, it supplies a processing solution further containing an oxidizing agent from the processing solution supplying means.

Alternatively, it supplies a processing solution further containing a surface-active agent from the processing solution supplying means.

Due to this, the surface of the film oxidized by the oxidizing agent etc. is chelated by reacting with the chelating agent supplied as the processing solution, whereby an easily removable low mechanical strength chelate film is formed. This can be easily removed by the processing solution supplied over the surface so as to be substantially parallel to that surface, whereby the film can be flattened.

If a surface-active agent is added to the processing solution in this way, the chelate film formed on the surface to be polished is converted to micelles by the surface-active agent. These micelles are not bound by any bonding force to the lower film and are merely precipitated and deposited there by their own weight, so can be easily removed by the processing solution flowing substantially parallel to the surface.

To achieve the above object, according to a fourth aspect of the present invention, there is provided a polishing apparatus for an object having a film on a surface to be polished, comprising a cathode member arranged facing the surface; an electrolytic solution supplying means for supplying an electrolytic solution between the surface and the cathode member and over the surface at least substantially parallel to the surface; and a power supply for supplying voltage with the cathode member as a cathode and the film as an anode and removing by polishing preferentially projecting portions of the film by the shear stress of the processing solution.

When voltage is supplied with the cathode member as a cathode and the film as an anode, the surface of the film is electrolytically eluted. Alternatively, when the electrolytic solution includes a chelating agent, due to this application of voltage, the surface of the film is anodically oxidized and is chelated by the chelating agent. At this time, since the electrolytic solution flows over the surface so as to be substantially parallel to the surface, a shear stress of the electrolytic solution acts to promote the electrolytic elution or removal of the chelate film. Due to this, the initial unevenness can be easily flattened. Further, the film can be polished efficiently while maintaining the flatness.

Further, since no strong pressure is applied to the surface as in chemical mechanical polishing, polishing is possible while suppressing the damage to the interlayer insulating film etc. below the film to be polished.

Preferably, the polishing apparatus polishes an object wherein the film comprises a copper film.

That is, the polishing apparatus of the present invention is suitable as an apparatus for polishing a copper film which had been processed by CMP in the conventional damascene process etc.

Preferably, the polishing apparatus supplies an electrolytic solution containing at least a chelating agent from an electrolytic solution supplying means.

More preferably, it supplies an electrolytic solution further containing a surface-active agent from the processing solution supplying means.

Due to this, the anodically oxidized surface of the film is chelated by reacting with the chelating agent supplied as the electrolytic solution, whereby an easily removable low mechanical strength chelate film is formed. Due to the electrolytic solution flowing substantially parallel to that surface, the chelate film at the projecting portions is easily and preferentially removed by polishing. New surfaces for polishing are exposed at the projecting portions from which the surface chelate film had been removed.

At this time, since the electrical resistance of the chelate film is far higher than that of the copper or other film, the film covered by the chelate film at the recessed portions remaining without being removed is inhibited from being anodically oxidized by the conductance. New chelate film is formed by anodic oxidation only at the projecting portions of the surface exposed by the removal of the chelate film.

Further, in the anodic oxidation, the shorter the distance between the cathode member and the film, the higher the current density, so even among the surfaces exposed by removal of the chelate film, the ones of the parts projecting out more have a larger current density and a faster speed of anodic oxidation so are accelerated in chelation.

By repeating this preferential removal of the projecting portions by the formation of a chelate film and striking action of the electrolytic solution with the chelate film, it is possible to flatten the film to be polished.

If a surface-active agent is added, the chelate film formed on the surface to be polished is converted to micelles by the surface-active agent. These micelles can be easily removed by the processing solution flowing substantially parallel to the surface.

Preferably, the power supply is a direct current power supply which supplies a predetermined voltage with the cathode member as a cathode and the film as an anode.

More preferably, the direct current power supply supplies a pulse-like voltage having a predetermined period.

For example, making the pulse width extremely short makes the amount of formation of chelate film by the anodic oxidation per pulse very small. This is effective for preventing sudden and huge anode oxidation of the copper film caused by discharge due to a sudden change of the distance between electrodes in a case of contact with unevenness of the surface or spark discharge due to a sudden change of electrical resistance occurring when air bubbles, particles, or the like are interposed and for achieving continuity of as small amounts as possible.

Preferably, the apparatus further comprises an anode member facing the surface to be polished and separated from the cathode member by a predetermined distance; the electrolytic solution supplying means supplies an electrolytic solution between the surface and the cathode member and between the surface and the anode member; and the power supply supplies voltage to the cathode member and the anode member.

More preferably, the anode member is comprised of a nobler metal than the material of the film.

Due to this, it possible to prevent elution of the cathode member into the electrolytic solution and to positively cause anodic oxidation of the copper film. Note that since the cathode is not eluted, there is no need to consider the relative nobleness of the material.

Preferably, the polishing apparatus further comprises an ammeter for measuring the value of a current flowing between the cathode member and the film.

More preferably, it further comprises a controller for controlling the voltage supplied by the power supply so that the current value obtained from the ammeter becomes constant.

By controlling the current value to be constant, the current density becomes constant at all times and the amount of formation of chelate film by the anodic oxidation can be controlled to be constant.

Further, by monitoring the electrolytic current, it is possible to manage the polishing process and possible to obtain an accurate grasp of the state of progress of the polishing process.

More preferably, the polishing apparatus manages progress of polishing of the film by a direct current value obtained from the ammeter.

For example, by using a chelating agent giving an electrical resistance of the chelate film formed larger than a copper film, the current flowing between the cathode member and copper film removes the chelate film of the projecting portions before the projecting portions of the copper film are flattened. Since the copper is then exposed, the current value increases and new chelate film is formed on the exposed copper, whereupon the current falls. This pattern is repeated. On the other hand, when the copper film is flattened, the entire surface of the copper film is exposed by the removal of the chelate film from all of the copper film, so the current value reaches a maximum value. The current value reaches its maximum level with each subsequent removal.

Here, when all of the copper film on the barrier metal film at the outside of the interconnection grooves is removed and the barrier metal film is exposed, since the resistance of the barrier metal film is usually larger than that of copper, the current value starts to fall from its maximum level after the removal of the chelate film, so by stopping the application of voltage when it starts to fall, it is possible to stop the formation of the chelate film by subsequent anodic oxidation and therefore possible to manage the progress of polishing.

BRIEF DESCRIPTION OF THE DRAWINGS

The above objects and features of the present invention will be more apparent from the following description of the preferred embodiments given with reference to the accompanying drawings, wherein.

DESCRIPTION OF THE PREFERRED EMBODIMENTS

Below, an explanation will be made of preferred embodiments of a polishing method and a polishing apparatus of the present invention by referring to the accompanying drawings.

First Embodiment

The first embodiment relates to application of the polishing method of the present invention to a process of formation of copper interconnections by a dual damascene process in a process of production of a semiconductor device.

Figure 1A:
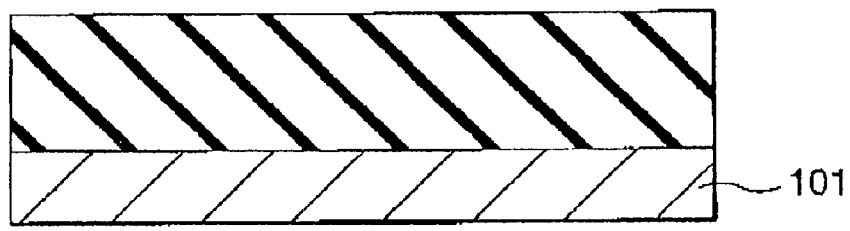
FIGS. 1A to 1L are sectional views of steps of the method of producing a semiconductor device according to a first embodiment of the present invention.

First, as shown in FIG. 1A, for example an interlayer insulating film 102 made of for example silicon oxide is formed by low pressure chemical vapor deposition (CVD) on a silicon or other semiconductor substrate 101 on which a not illustrated impurity diffusion region is suitably formed by using for example tetraethyl orthosilicate (TEOS) as a reaction source.

Figure 1B:
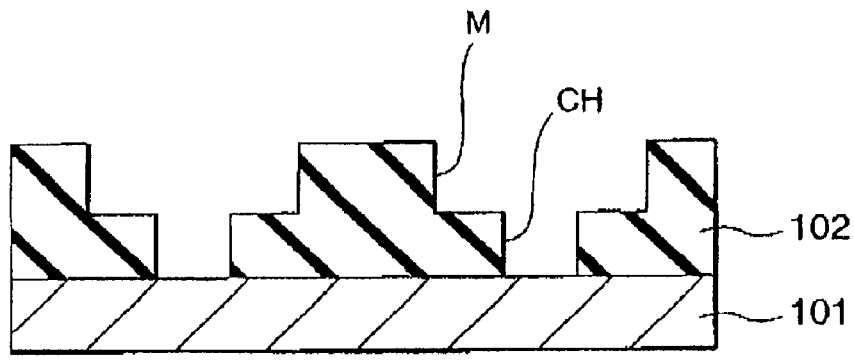

Next, as shown in FIG. 1B, contact holes CH communicating with the impurity diffusion region of the semiconductor substrate 101 and interconnection grooves M are formed by well-known photolithography and etching. The depth of the interconnection use grooves M is for example about 800 nm.

Figure 1C:
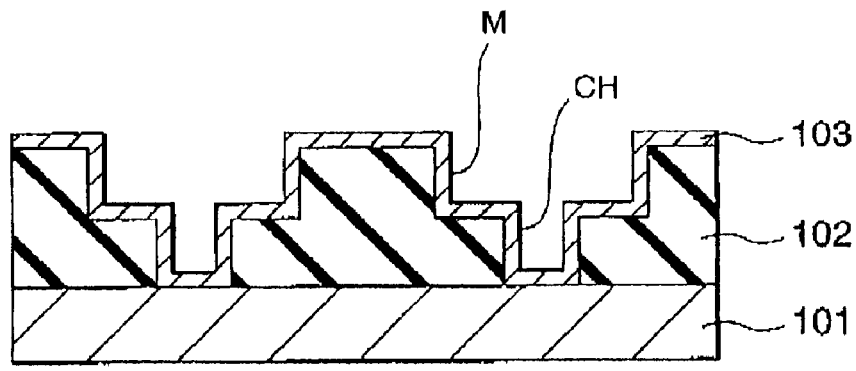

Next, as shown in FIG. 1C, a barrier metal film 103 is formed on the surface of the interlayer insulating film 102 and in the contact holes CH and the interconnection grooves M. This barrier metal film 103 is formed by a material such as Ta, Ti, W, Co, TaN, TiN, WN, CoW, or CoWP to a thickness of for example about 25 nm by physical vapor deposition (PVD) using a sputtering system, a vacuum vapor deposition system, or the like.

The barrier metal film 103 is provided in order to prevent the diffusion of the material comprising the interconnections into the interlayer insulating film 102 and to increase the bondability with the interlayer insulating film 102. Particularly, as in the present embodiment, when the interconnection material is copper and the interlayer insulating film 102 is silicon oxide, since copper has a large coefficient of diffusion in silicon oxide, it can be easily oxidized. This must be prevented.

Figure 1D:
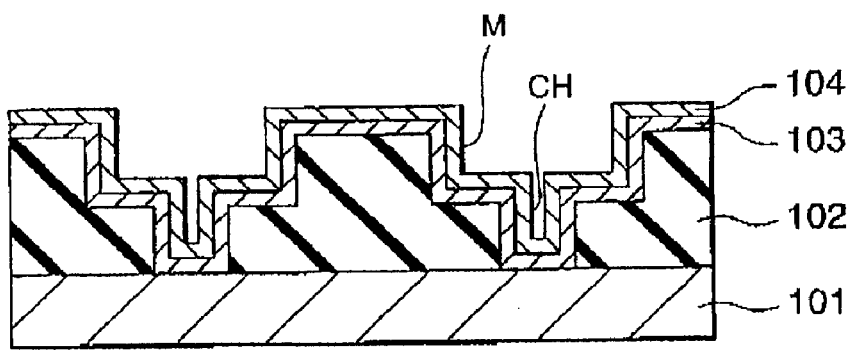

Next, as shown in FIG. 1D, a seed film 104 made of a material the same as the material for forming the interconnections is formed on the barrier metal film 103 to a thickness of for example about 150 nm by well-known sputtering. The seed film 104 is formed so as to accelerate the growth of copper grains when burying the interconnection grooves M and the contact holes CH with copper.

Figure 1E:
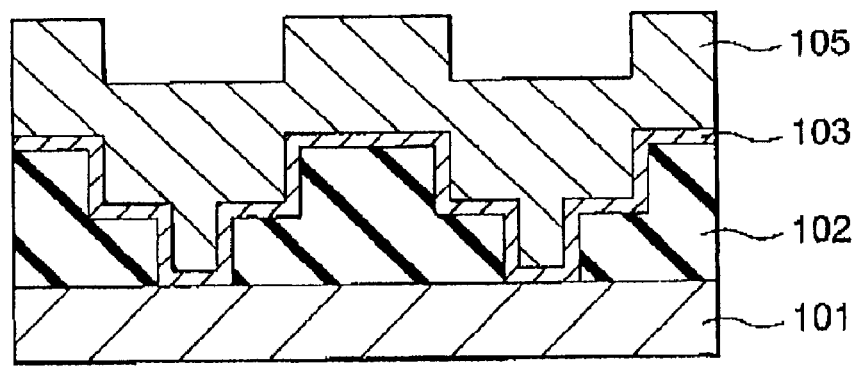

Next, as shown in FIG. 1E, an interconnection layer 105 made of copper is formed on the barrier metal film 103 to a thickness of for example about 1600 nm so as to bury the contact holes CH and the interconnection grooves M. The interconnection layer 105 is preferably formed by electroplating or electroless plating, but it is also possible to form the interconnection layer 105 by CVD, PVD, sputtering, or the like. Note that the seed film 104 is integrally formed with the interconnection layer 105.

Due to the burying of the contact holes CH and the interconnection grooves M, unevenness having a height of for example about 800 nm is caused on the surface of the interconnection layer 105.

The above process is carried out in a manner similar to the related art, but in the polishing method of the present invention, the excess interconnection layer 105 present on the interlayer insulating film 102 is removed by not chemical mechanical polishing, but electrolytic composite polishing using electrolytic action. Specifically, the copper film is anodically oxidized by electrolytic action to form a chelate film on the surface.

Figure 1F:
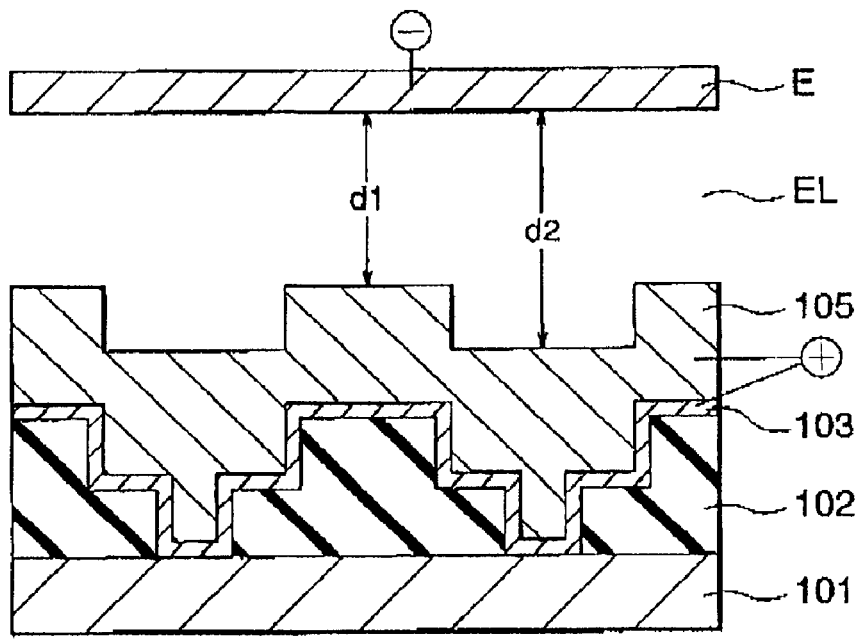

The method of formation of the chelate film comprises, as shown in FIG. 1F, arranging a cathode member E in parallel to the copper film 105 and interposing an electrolytic solution EL including a chelating agent for chelating the copper between the cathode member E and copper film 105. The electrolytic solution EL includes, in addition to the chelating agent, for example, copper sulfate or another electrolyte so as to reduce the voltage supplied between the cathode member E and copper film 105. Note that from FIG. 1H on, illustration of the cathode member E and the electrolytic solution EL will be omitted.

Here, as the chelating agent, use may be made of for example quinaldinic acid of chemical formula (1), glycine of chemical formula (2), citric acid of chemical formula (3), oxalic acid of chemical formula (4), propionic acid of chemical formula (5), anthranilic acid of chemical formula (6), phenylalanine of chemical formula (7), or so on.

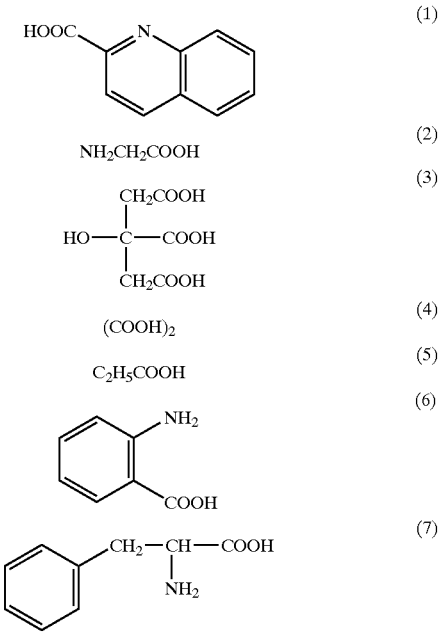

Next, voltage is supplied with the cathode member E as a cathode and the copper film 105 and barrier metal film 103 as an anode.

The anode, that is, the copper film 105, is anodically oxidized and forms CuO. Here, the distance d1 between a projecting portion on the surface of the copper film 105 and the cathode member E is shorter than the distance d2 between a recessed portion on the surface of the copper film 105 and the cathode member E, so when the potential difference between the cathode member E and the copper film 105 is constant, the current density at the projecting portion is greater than that at the recessed portion and therefore the anodic oxidation is accelerated.

Figure 1G:
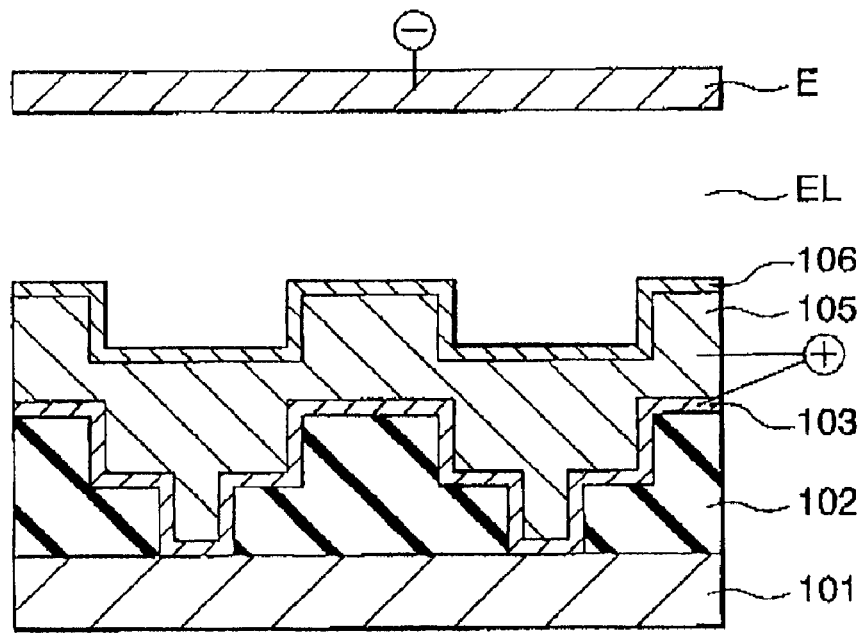

As shown in FIG. 1G, the surface of the anodically oxidized copper film (CuO) 105 is chelated by the chelating agent in the electrolytic solution. When quinaldinic acid is used as the chelating agent, a film made from a chelated compound of the chemical formula (8) is formed. When glycine is used, a film made from a chelate compound of the chemical formula (9) is formed.

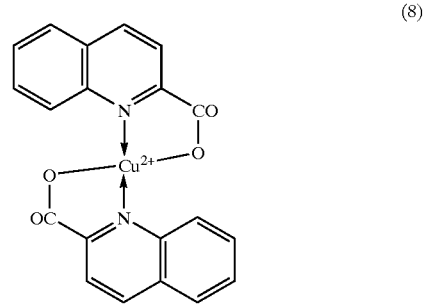

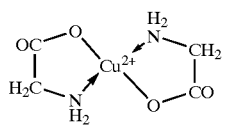

(9)

These chelate films 106 have an electrical resistance higher than copper and a very low mechanical strength. Therefore, after the chelate film 106 is formed on the surface of the copper film 105, the value of the current from the copper film 105 to the cathode member E via the electrolytic solution EL decreases.

Figure 1H:
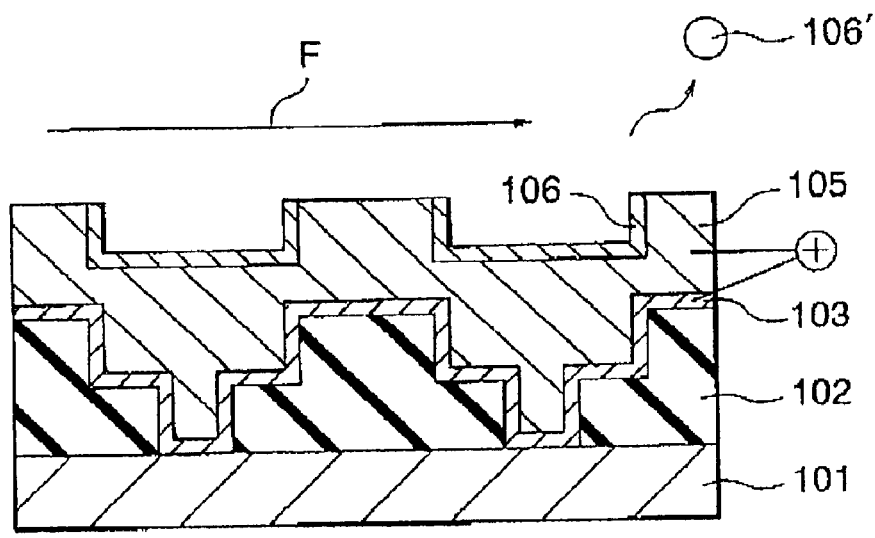

Next, as shown in FIG. 1H, the projecting portions of the chelate film 106 formed on the surface of the copper film 105 are selectively removed by a jet flow F of the electrolytic solution.

Because the mechanical strength of the chelate film 106 is very low, by causing the jet flow F of the electrolytic solution to flow over the copper film 105 formed with the chelate film 106 to be substantially parallel to the copper film 105, the chelate film 106 is easily and preferentially removed by polishing easily by the electrolytic solution having the large kinetic energy directly striking the side surfaces of the projecting portions.

Because the projecting portions of the copper film 105 of the low electrical resistance are exposed in the electrolytic solution at that time, the value of the current flowing from the copper film 105 to the cathode member E via the electrolytic solution EL rises.

Figure 1I:
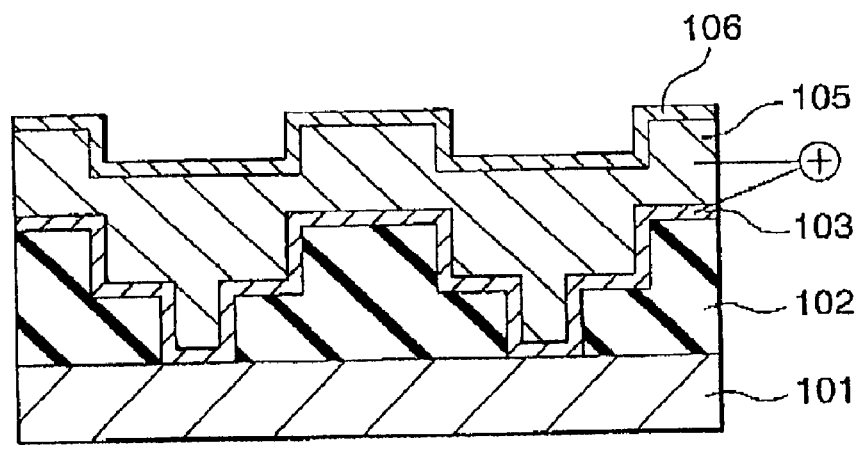

Next, as shown in FIG. 1I, since the projecting portions of the copper film 105 exposed in the electrolytic solution have a low electrical resistance and a short distance to the cathode member E, they are intensively anodically oxidized, and the anodically oxidized copper is chelated. At this time, the value of the current flowing from the copper film 105 to the cathode member E via the electrolytic solution EL again falls.

Next, the projecting portions of the chelate film 106 are selectively removed by the jet flow F of electrolytic solution supplied substantially parallel to the copper film 105, the exposed copper film 105 is intensively anodically oxidized and chelated, and the projecting portions of the chelate film 106 are selectively removed. These steps are then repeated.

The current flowing from the copper film 105 to the cathode member E via the electrolytic solution EL repeatedly rises and falls together with removal and formation of the chelate film 106, respectively.

Figure 1J:
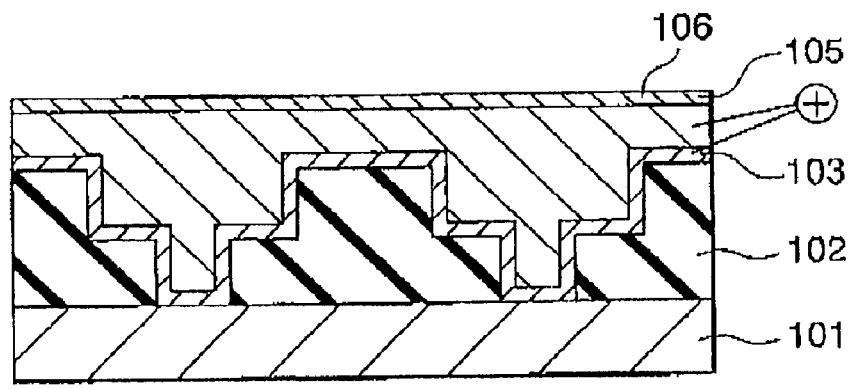

Next, as shown in FIG. 1J, after the above step, the copper film 105 is flattened. Part of the flattened copper film 105 is removed over the entire surface by the jet flow F of the electrolytic solution flowing substantially parallel to the copper film 105, so the value of the current flowing from the copper film 105 to the cathode member E through the electrolytic solution EL becomes the maximum value once.

Figure 1K:
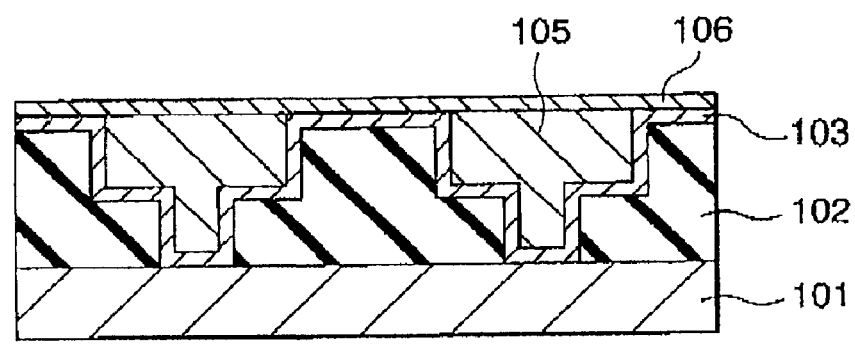

Next, as shown in FIG. 1K, the step of removal of the chelate film produced by the anodic oxidation is repeated over the entire surface of the flattened copper film 105 until there is no longer any excess copper film on the barrier metal film 103.

Figure 1L:
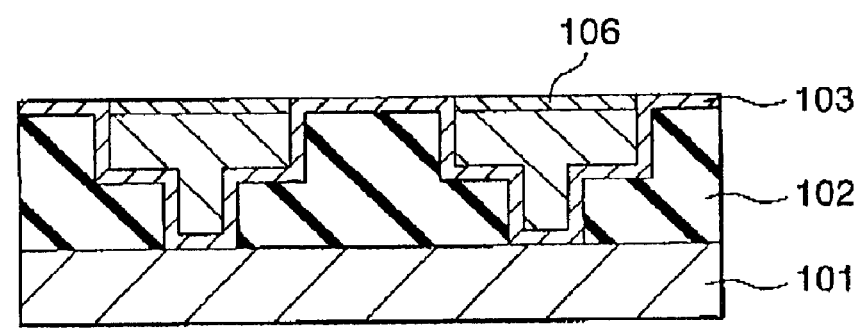

Next, as shown in FIG. 1L, part of the entire surface of the copper film 105 is removed by the jet flow F of the electrolytic solution flowing substantially parallel to the copper film 105 to expose the surface of the barrier metal film 103. At this time, since the barrier metal film having the high electrical resistance is exposed from the copper film 105, the value of the current after removal of the chelate film 106 starts to fall. At the point of time when the value of the current starts to fall, the application of the voltage is stopped and the progress of the chelation due to anodic oxidation is ceased. By the process up to here, flattening of the initial unevenness of the copper film 105 is achieved.

Next, the barrier metal film deposited outside the contact holes and the interconnection grooves is removed, whereby the copper interconnections are formed.

In addition, in the present embodiment, it is preferable to add polyoxyethylenealkylether, alkylbenzenesulfonate, or another surface-active agent to the electrolytic solution.

Figure 2:
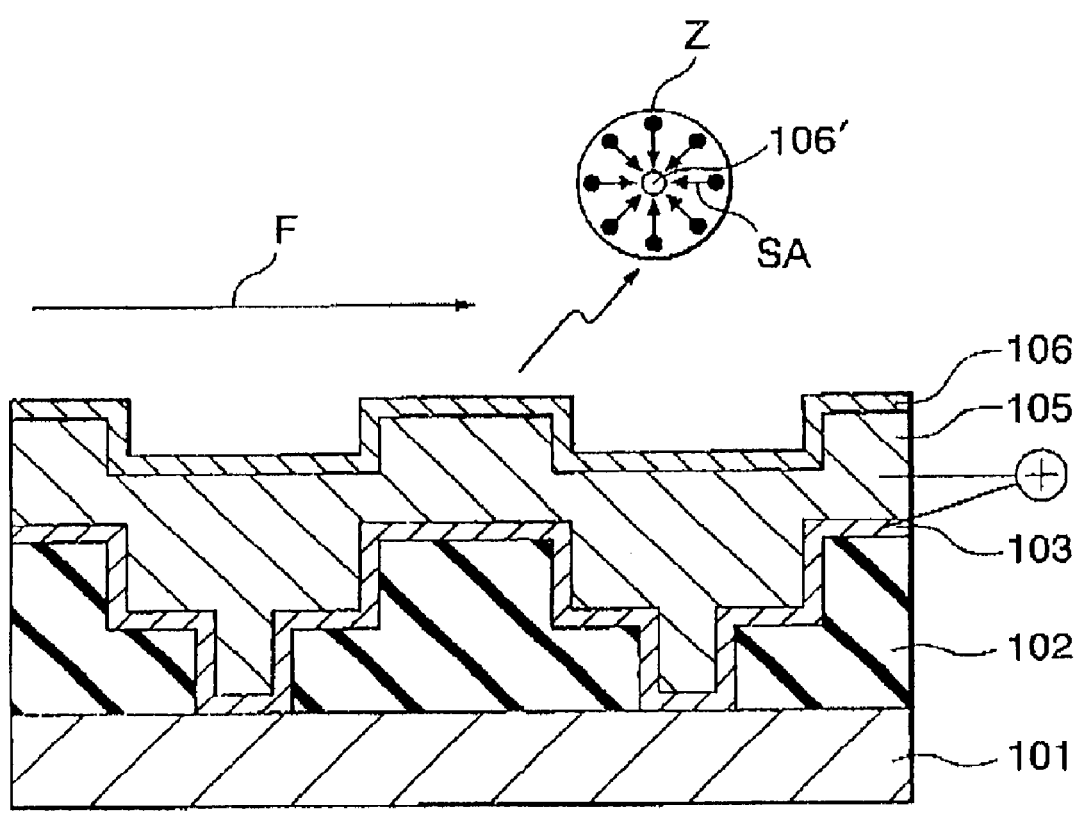
FIG. 2 is a schematic view showing removal by formation of micelles when adding a surface-active agent.

As shown in FIG. 2, the surface-active agent SA in the electrolytic solution envelops an insoluble chelate 106' formed on the surface of the copper film 105 to form micelles. The insoluble complex micelles Z are not bound by any bonding force to the lower film and are merely precipitated and deposited there by their own weight, so can be separated easily from the surface of the copper film 105. They are easily removed by the jet flow F of the electrolytic solution supplied substantially parallel to the copper film 105. Further, selective removal from the projecting portions becomes easy.

According to the polishing method of the present embodiment, it is possible to perform the polishing by a low processing pressure compared with the usual chemical mechanical polishing since the polishing rate is assisted electrochemically. This is extremely advantageous in terms of reducing the scratches, the performance in easing step differences, the reduction of dishing or erosion, etc. even compared with simple mechanical polishing.

Further, the fact that polishing is possible by a low processing pressure is extremely useful when using for the interlayer insulating layer 102 an organic low dielectric constant film or porous low dielectric constant insulating film important for the 0.13 µm generation and on, but weak in mechanical strength and easily broken by usual chemical mechanical polishing.

In usual chemical mechanical polishing, when using a slurry containing alumina particles etc., the alumina particles sometimes remain without being consumed after contributing to the CMP process or may be buried in the surface of the copper. In the polishing method of the present invention, however, since the chelate film formed on the surface of the film to be polished has an extremely small mechanical strength, it can be removed by a jet flow of an electrolytic solution not containing a polishing abrasive is possible.

Further, by monitoring the electrolytic current, it is possible to manage the polishing process and possible to obtain an accurate grasp of the state of progress of the polishing process.

The polishing method of the present invention is not limited to the above embodiment.

For example, it may be applied to the polishing or flattening of copper even when using copper for portions other than interconnections. Further, the type of the chelating agent and materials of the cathode member etc. may be changed in various ways within the scope of the gist of the present invention.

Further, for example, as methods other than the method of polishing copper, the method of formation of contact holes or interconnection grooves, the method of formation of a copper film, the method of formation of a barrier metal film, etc. may be changed in various ways within the scope of the gist of the present invention.

Second Embodiment

Figure 3:
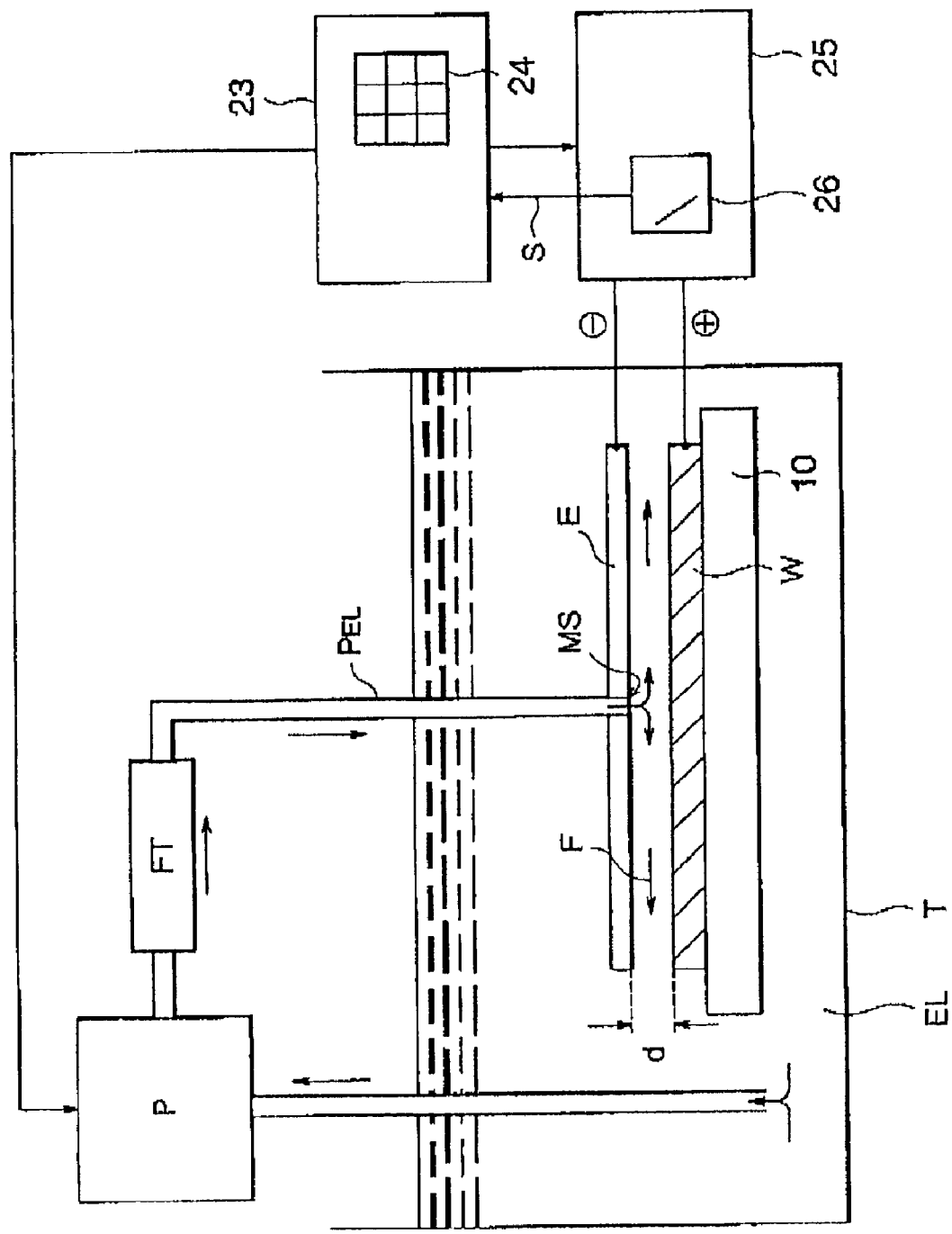
FIG. 3 is a schematic view of a polishing apparatus according to a second embodiment of the present invention.

FIG. 3 is a schematic view of the configuration of a polishing apparatus used in the process of polishing a copper film of the above interconnection layer.

Namely, the polishing apparatus of the present embodiment includes a table 10 for carrying a wafer W to be polished (hereinafter, also referred to as "wafer") that has a copper film on its surface, a securing means such as a vacuum chuck provided on the table 10, a controller 23, a control panel 24, a power supply 25, an ammeter 26, a cathode member E, an electrolytic bath tank T for storing the electrolytic solution EL, a jet pump P, a filter FT, and an electrolytic solution pipe $P_{EL}$.

Note that, although not illustrated in the figure, the above polishing apparatus is installed in a clean room, and a loading/unloading port for loading and unloading a wafer cassette storing wafers to be polished in or out of the clean room is provided in the clean room. Further, a wafer conveyance robot for transferring the wafers between the wafer cassette loaded in the clean room through this loading/unloading port and the polishing apparatus is arranged between the loading/unloading port and the polishing apparatus.

The wafer W, for example, is secured by a securing means such as a vacuum chuck on the fixed rotatable table 10. As the securing means, in addition to a vacuum chuck, use can also be made of an edge clamp or a mechanical clamp. In case of an edge clamp, a current can be supplied to the wafer that serves as the anode through the clamp portion grounding the edge portion of the wafer.

The wafer W is arranged facing the cathode member E and is immersed in the electrolytic solution EL in the electrolytic bath tank T.

Here, the electrolytic solution EL includes copper sulfate or another electrolyte for reducing the voltage supplied between the cathode member E and the copper film 105 in addition to the quinaldinic acid or other chelating agent for chelating the copper as explained in the first embodiment. Further, it may contain a surface-active agent.

The cathode member E, for example, is a circular plate comprised of oxygen-free copper and is fixed or rotatable arranged parallel with the wafer in the electrolytic solution EL.

At the edge of the wafer, for example, by conductance through the clamp portion grounded at places 2 mm away from the edge, a direct-current voltage or a pulse voltage is applied by the power supply 25 with the surface of the wafer, that is, the copper film, as an anode and the cathode member E as a cathode.

If the above voltage is supplied, as described in the first embodiment, the surface part of the film is anodically oxidized and the oxidized surface part is chelated by the chelating agent in the electrolytic solution.

The formed chelate film has an extremely small mechanical strength, so if a jet flow of the electrolytic solution is supplied over the copper film formed with the chelate film so as to be substantially parallel to the copper film, it is easily removed by polishing by the shear stress of the electrolytic solution.

Here, the electrolytic solution EL in the tank T is pumped up by the jet pump P through the electrolytic solution pipe $P_{EL}$ and ejected from the ejection port MS provided at the substantial center of the cathode member E. The distance d between the cathode member E and the wafer W is set to a predetermined amount so that the jet flow of the electrolytic solution is supplied over the copper film formed with the chelate film so as to be substantially parallel to the copper film.

If the distance d of the cathode member E and wafer W is too small, the flow action of the electrolytic solution interposed between the cathode member E and the wafer W is not sufficient, so it is preferable to set it at over a predetermined value.

Further, it is possible to provide a filter FT in the electrolytic solution pipe $P_{EL}$ in accordance with need. By this, it is possible to trap insoluble chelate or insoluble complex micelles or other unnecessary components pumped up together with the electrolytic solution EL.

It is also possible to provide the electrolytic solution pipe $P_{EL}$ with a mechanism for replenishing components consumed by the above process such as quinaldinic acid.

The power supply is not a low voltage power supply that outputs a constant voltage at all times, but preferably is a DC power supply with a built-in switching regulator circuit for outputting voltage in pulses by a certain cycle.

Specifically, use is made of a power supply that outputs a pulse voltage by a certain cycle and is able to be suitably changed in pulse width. As an example, use may be made of a power supply whose output voltage is DC 100 to 150V, or 30V depending on the voltage tolerance of a semiconductor device, whose maximum output current is 2 to 3A (for example 2.2A), and whose pulse width may be changed to 1, 2, 3, 5, 10, 20, or 30 $\mu$s.

The voltage and pulse width of the above pulse voltage can be selected by the distance between the wafer and the cathode member and the electrical resistance of the electrolytic solution so as to enable the most effective removal of the copper film.

Outputting a pulse voltage with a short width as explained above is for making the amount of the anodic oxidation per pulse very small. Namely, this is effective for preventing sudden and huge anode oxidation of the copper film compared with the target amount of removal due to discharge caused by a sudden change of the distance between electrodes in a case of contact with unevenness of the surface of the wafer or spark discharge due to a sudden change of electrical resistance occurring when air bubbles, particles, or the like are interposed and for achieving continuity of as small amounts as possible.

Further, since the output voltage is relatively high compared with the output current, it is possible to set a certain mechanical safety margin when setting the electrode distance. Namely, even if the electrode distance changes somewhat, since the output voltage is high, the change in the current value is small.

The power supply 25 is provided with an ammeter 26. The ammeter 26 can monitor the electrolytic current of the anodic oxidation. The monitored current value signal S is output to the controller 23. Further, it is also possible to provide a current resistance value measuring means instead of an ammeter. This fulfills a similar function to an ammeter.

The controller 23 adjusts the voltage supplied from the power supply or the pulse conditions etc. or controls the operation of the power supply such as the cessation of supply of voltage by the power supply based on the current value specified by the current value signal S from the ammeter provided at the power supply 25.

For example, by controlling the current value to be constant, the current density always becomes constant and the amount of chelate film produced by the anodic oxidation can be controlled to be constant.

Further, by monitoring the electrolytic current, as explained in the first embodiment, it is possible to manage the polishing process and possible to obtain an accurate grasp of the state of progress of the polishing process.

Further, it is also possible to adjust the operating speed of the jet pump P and adjust the flow rate of the electrolytic solution in accordance with need.

Further, the controller 23 is provided with a control panel 24. An operator may input various types of data in accordance with need. Further, this may display the current value signal S for example.

Figure 4A:
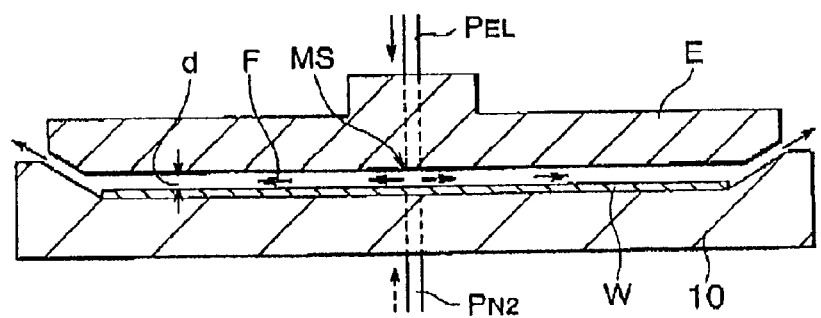
FIGS. 4A and 4B are enlarged schematic sectional views of principal parts of the polishing apparatus according to the second embodiment.

FIG. 4A is an enlarged schematic sectional view of principal parts such as the wafer W, table 10, and cathode member E.

For example, a wafer W is secured on the table 10 by a not shown vacuum chuck. The cathode member E is arranged at a predetermined distance d from this so as to face the surface of the wafer to the polished over the entire area. The table 10 and the cathode member E are each either fixed in place or rotatable.

The electrolytic solution is supplied by the pipe $P_{EL}$ from the opposite side of the cathode member E from the side facing the wafer and is jetted between the cathode member E and the wafer W from an ejection port MS provided at the approximate center of the cathode member E.

The jetted electrolytic solution flows along the space between the cathode member E and the wafer W, flows over the surface of the wafer W to be polished substantially parallel to the surface, and is discharged out from the wafer W.

When desiring to avoid the electrolytic solution seeping to the back side of the wafer W, nitrogen gas may be supplied from a pipe $P_{N2}$ from the opposite side of the table 10 to the wafer side and blown on the back side of the wafer.

Figure 4B:
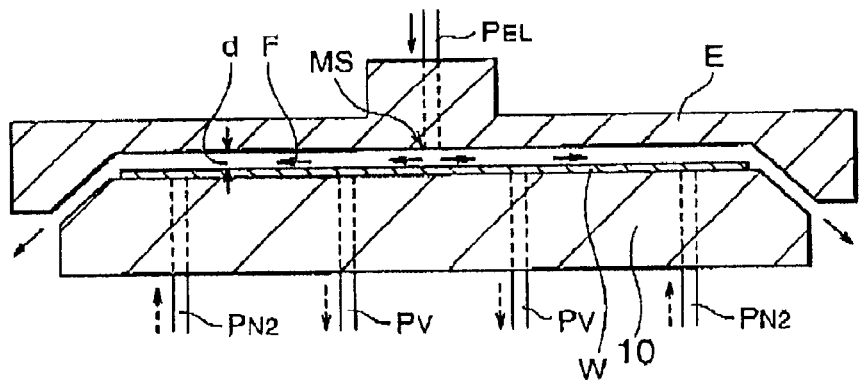

FIG. 4B is a schematic sectional view of another configuration of principal parts such as the wafer W, table 10, and cathode member E.

For example, a wafer W is secured on the table 10 by suction from the reverse side of the table 10 to the wafer side by the pipe $P_V$. The cathode member E is arranged at a predetermined distance d from it so as to face the surface of the wafer W to be polished over the entire area. Electrolytic solution is supplied from the pipe $P_{EL}$ from the opposite side of the cathode member E from the side facing the wafer and is jetted between the cathode member E and the wafer W from an ejection port MS provided at the approximate center of the cathode member E.

When desiring to avoid the electrolytic solution seeping to the back side of the wafer W, nitrogen gas may be supplied from a pipe $P_{N2}$ from the opposite side of the table 10 to the wafer side outward from the suction part of the pipe $P_V$ and blown on the back side of the wafer.

FIGS. 5A to 5E are examples of the configuration of the cathode member E.

Figure 5A:
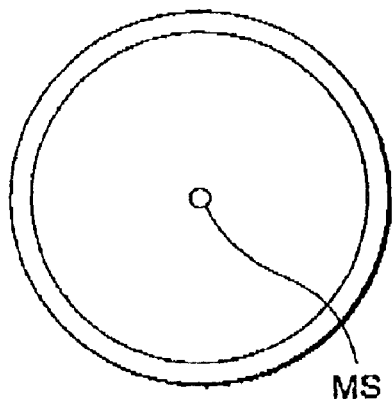
FIGS. 5A to 5E are examples of the configuration of the cathode member of the polishing apparatus according to the second embodiment.

FIG. 5A shows an example where the ejection port MS is provided at the approximate center of a flat cathode member.

FIGS. 5B to 5E show examples where grooves G are formed at the surface of the cathode member. The direction of flow of the electrolytic solution can be controlled by these grooves G.

Figure 5B:
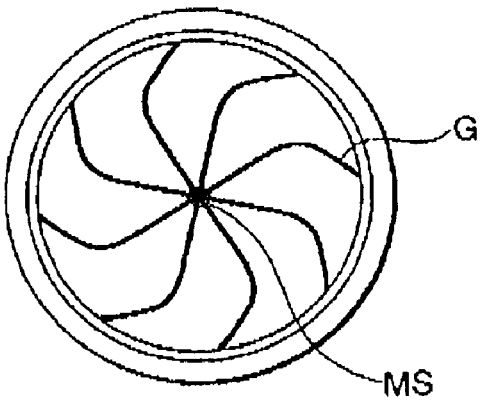

FIG. 5B shows an example where the ejection port MS is provided at the approximate center of the cathode member and clockwise or counterclockwise turbine-shaped grooves G are formed from the ejection port MS toward the outside of the cathode member.

Figure 5C:
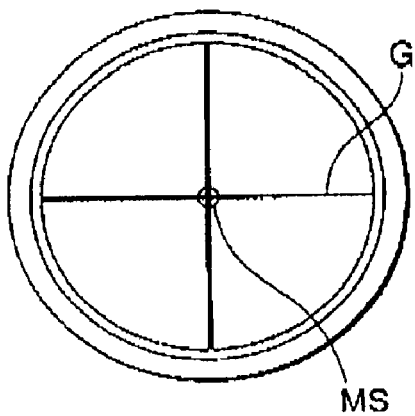

FIG. 5C shows an example where the ejection port MS is provided at the approximate center of the cathode member and grooves G are formed in a cross-shape from the ejection port MS.

Figure 5D:
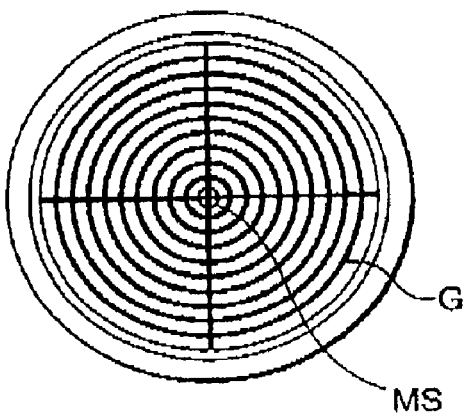

FIG. 5D shows an example where the ejection port MS is provided at the approximate center of the cathode member, grooves G are formed in a cross-shape from the ejection port MS, and concentric grooves G are formed communicating with them.

Figure 5E:
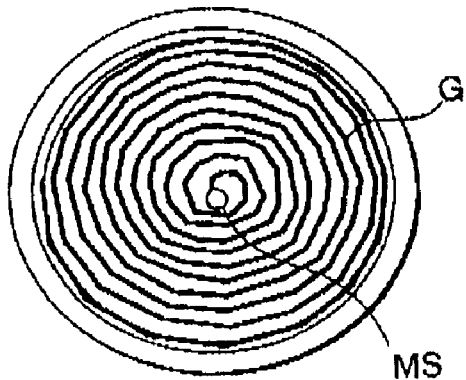

FIG. 5E shows an example where the ejection port MS is provided at the approximate center of the cathode member and a groove G is formed in a spiral shape from the ejection port MS.

In the above cathode members, it is also possible to provide a plurality of ejection ports at the surface of the cathode members. When providing a plurality of ejection ports, it is possible to arrange them on the surface of the cathode members to be symmetrical or arrange them randomly.

In the polishing apparatus of the above embodiment and the polishing method using the same, when supplying voltage with the cathode member as the cathode and the film to be polished as the anode, anodically oxidizing the surface of the film by the supply of voltage, and chelating the film by the chelating agent, the electrolytic solution is made to flow over the surface to be polished substantially parallel to the surface. Due to this, the chelate film is removed by the action of the shear stress due to the electrolytic solution, the initial unevenness can be easily flattened, and the film can be efficiently polished while maintaining flatness.

Further, since strong pressure is not applied to the surface as with chemical mechanical polishing, the film can be polished while suppressing damage to the interlayer insulating film under the film being polished.

Third Embodiment

Figure 6:
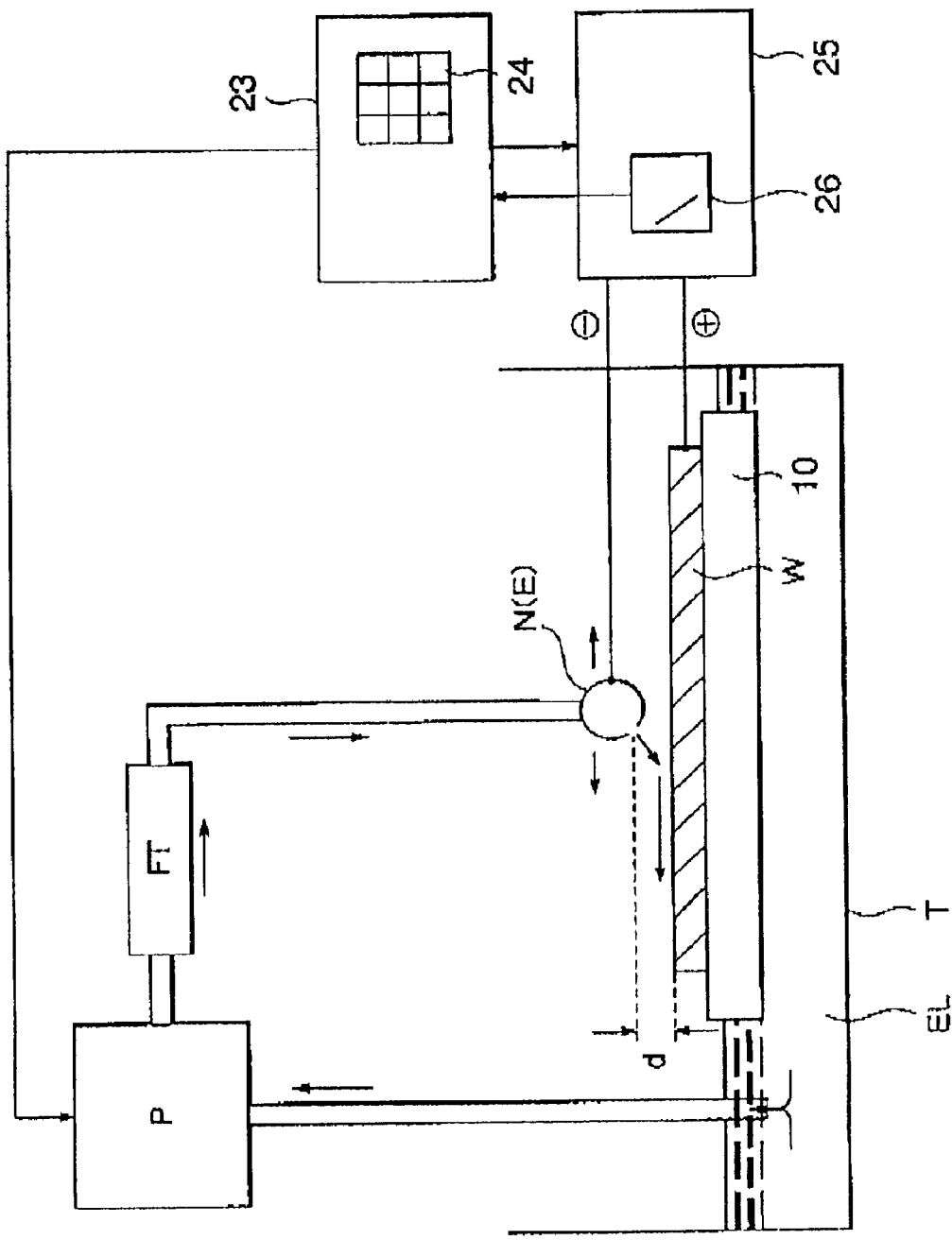
FIG. 6 is a schematic view of a polishing apparatus according to a third embodiment.

FIG. 6 is a schematic view of the configuration of a polishing apparatus according to a third embodiment.

The polishing apparatus according to this embodiment is similar to the polishing apparatus according to the second embodiment, but the cathode member E is formed as a hollow cylindrical nozzle N. Electrolytic solution EL is jetted from a slit SL provided in the nozzle N.

With the above configuration, the wafer and the cathode member E do not necessarily have to be immersed in the electrolytic solution EL stored in the tank. It is sufficient that the electrolytic solution EL supplied from the slit SL of the nozzle N contact both of the wafer W and the cathode member E to enable current to be conducted between the two.

The rest of the configuration is substantially the same as that of the polishing apparatus of the second embodiment.

Figure 7A:
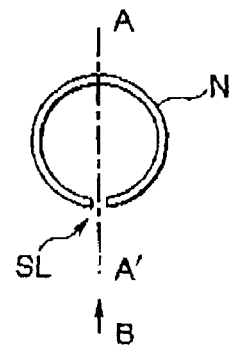
FIG. 7A is a sectional view at a plane vertical to a longitudinal direction of the nozzle of the polishing apparatus of the third embodiment.
Figure 7B:
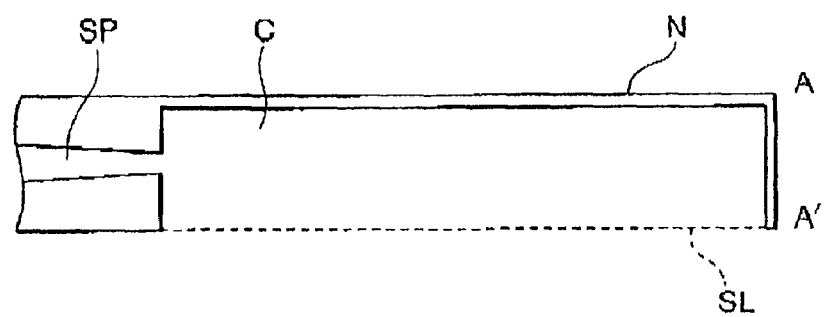
FIG. 7B is a sectional view along the line A–A' in FIG. 7A.
Figure 7C:
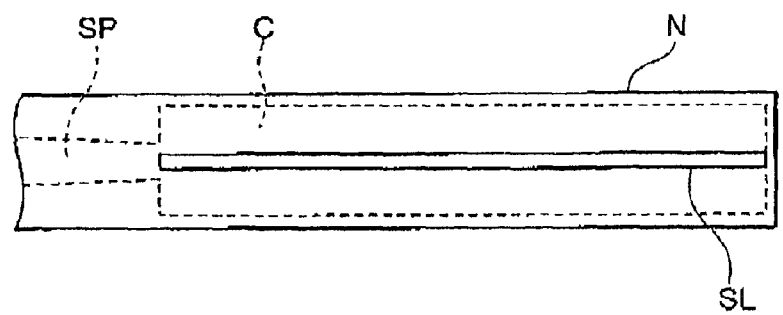
FIG. 7C is a front view from the direction B in FIG. 7A.

FIG. 7A is a sectional view in a plane vertical to the longitudinal direction of the hollow cylindrical nozzle N functioning as the cathode member, FIG. 7B is a sectional view along the line A–A' in FIG. 7A, and FIG. 7C is a front view from the direction B in FIG. 7A.

The nozzle N is for example comprised of copper or titanium and forms a cylindrical shape of for example a diameter of 20 mm and a height of 140 mm. It has a hollow center C. The hollow center C has a diameter of 18 mm and a height of 120 mm for example. The thickness of the wall is about 1 mm.

A slit SL extending in the height direction of the cylinder and having a width of about 0.2 mm and a length in the height direction of the cylinder of 110 mm is formed as an opening communicating with the hollow center C.

Further, an electrolytic solution supply port SP is formed inside the cylinder to communicate-with the hollow center C.

The electrolytic solution is supplied under pressure from the electrolytic solution supply port SP, fills the hollow center C, then is jetted from the slit SL.

Figure 8:
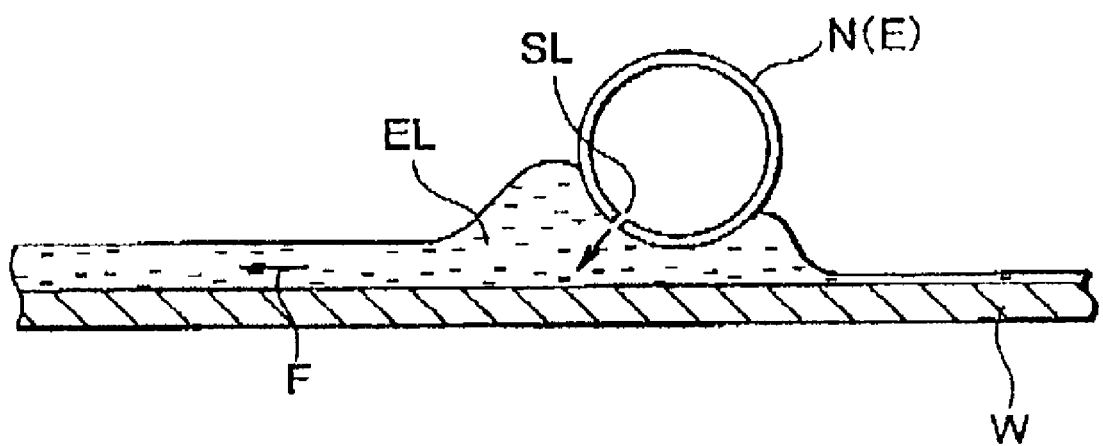
FIG. 8 is a sectional view when arranging the nozzle of the polishing apparatus of the third embodiment so as to face the wafer and supplying electrolytic solution from the nozzle.

FIG. 8 is a sectional view of the state where the hollow cylindrical nozzle N functioning as the cathode member E is arranged to face the wafer W having the film to be polished, not shown, and the electrolytic solution EL is supplied from the nozzle.

The direction of opening of the slit SL is inclined by about several tens of degrees with respect to the wafer W so that the electrolytic solution EL jetted from the slit SL becomes inclined with respect tho the wafer W surface. After the electrolytic solution EL strikes the wafer W, it flows over the wafer W substantially parallel to the surface of the wafer and becomes the jet flow F. At this time, the electrolytic solution EL contacts both the wafer W and the nozzle N due to surface tension, so current can be conducted between the wafer W and cathode member E.

By supplying voltage with the nozzle N functioning as the cathode member as the cathode and the film of the wafer W to be polished as the anode while supplying the electrolytic solution, a chelate film is formed by the anodic oxidation and chelation reaction at the surface of the film. This chelate film, which is low in mechanical strength, is removed by the shear force of the jet flow F of the electrolytic solution EL, whereby the film is polished flat.

If the distance d between the cathode member E and the wafer W is too short, the action of the flow of the electrolytic solution interposed between the cathode member E and the wafer W becomes insufficient, so it is preferable set to more than a certain value. If too great, however, the electrolytic solution EL will no longer be able to sufficiently contact both the wafer W and the nozzle N, so this is not desirable.

In the above, it is necessary to make the jet flow of the electrolytic solution reach the entire surface of the wafer so that the electrolytic solution jetted from the nozzle N acts evenly on the entire surface of the wafer.

Figure 9A:
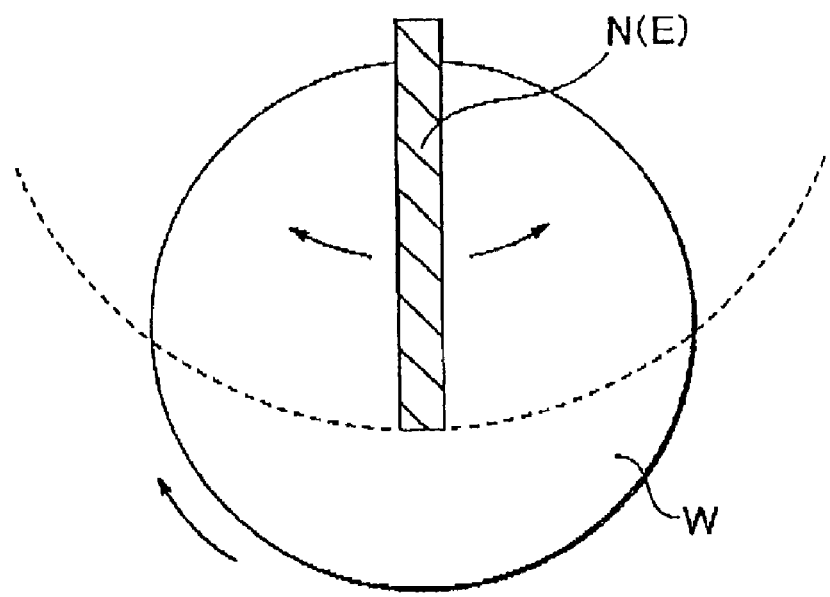
FIGS. 9A and 9B are schematic views of the direction of movement of a wafer and nozzle of the polishing apparatus according to the third embodiment.
Figure 9B:
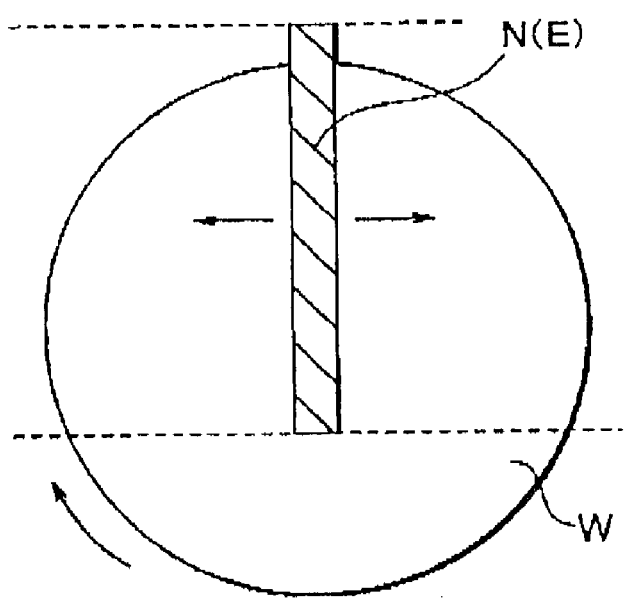

For example, the apparatus may be configured so as to have the nozzle N turn about its electrolytic solution supply port side while rotating the wafer W as shown in FIG. 9A or configured so as to have the nozzle N move parallel while the rotating the wafer W as shown in FIG. 9B.

In the polishing apparatus of the above embodiment and the polishing method using the same, when supplying voltage with the cathode member as the cathode and the film to be polished as the anode, anodically oxidizing the surface of the film by the supply of voltage, and chelating the film by the chelating agent, the electrolytic solution is made to flow over the surface to be polished substantially parallel to the surface. Due to this, in the same way as the second embodiment, the chelate film is removed by the action of the shear stress due to the electrolytic solution, the initial unevenness can be easily flattened, and the film can be efficiently polished while maintaining flatness.

Further, since strong pressure is not applied to the surface as with chemical mechanical polishing, the film can be polished while suppressing damage to the interlayer insulating film under the film being polished.

Still further, since the polishing apparatus of this embodiment is simple in configuration, it can be easily reduced in size, is easy to maintain, and enables an improvement in the operating efficiency.

Fourth Embodiment

Figure 10:
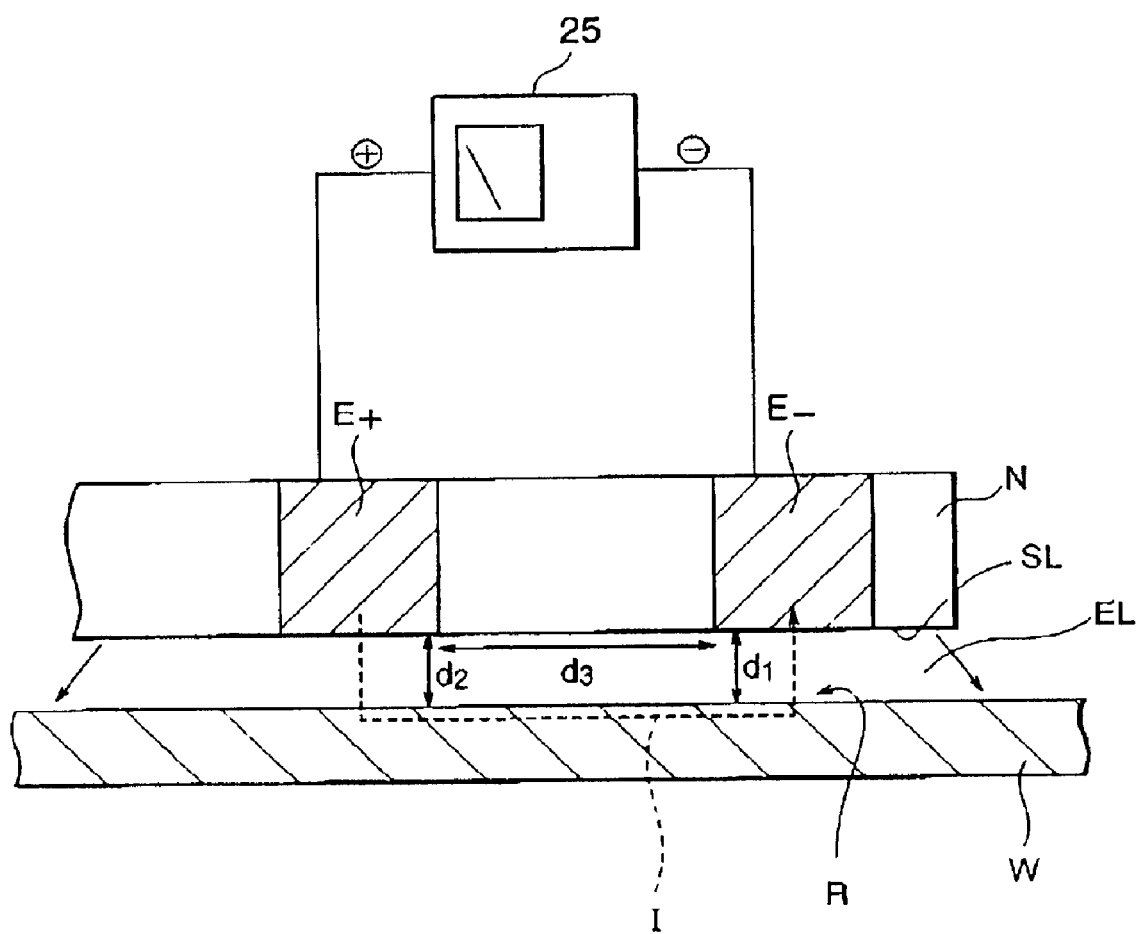
FIG. 10 is a schematic view of the configuration of a nozzle portion of a polishing apparatus according to a fourth embodiment.
Figure 11A:
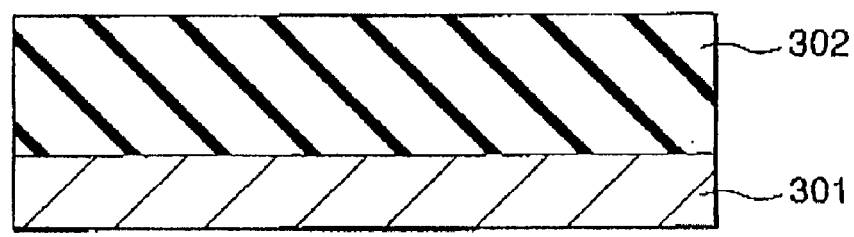
FIGS. 11A to 11F are sectional views of steps of the method of formation of copper interconnections by the dual damascene process according to an example of the related art.
Figure 11B:
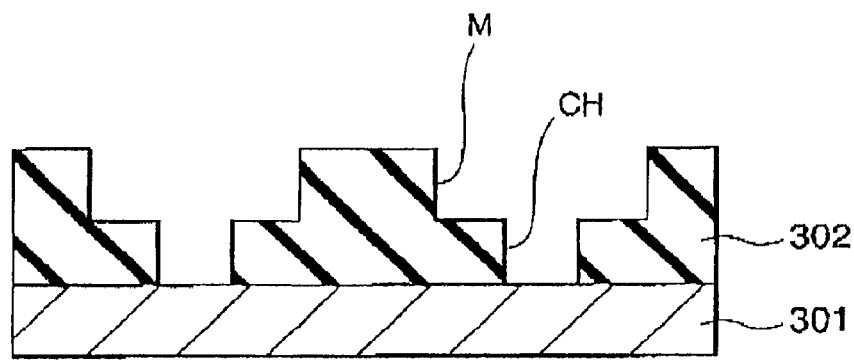
Figure 11C:
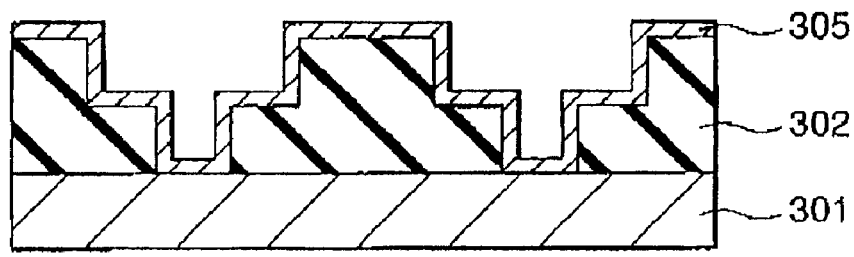
Figure 11D:
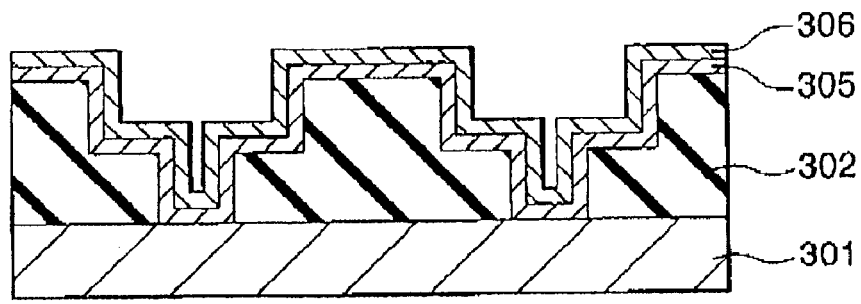
Figure 11E:
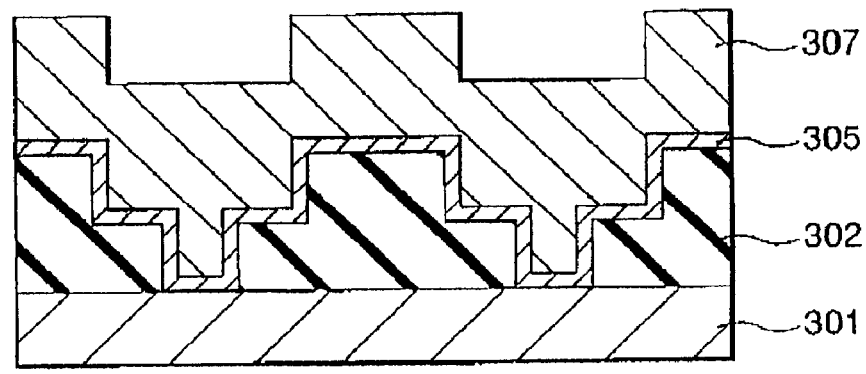
Figure 11F:
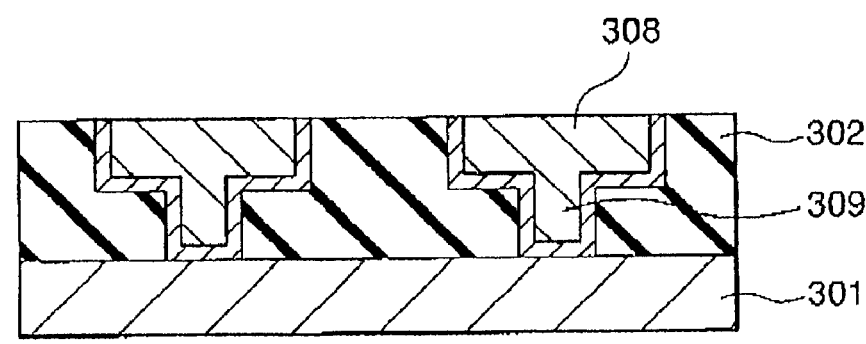
Figure 12:
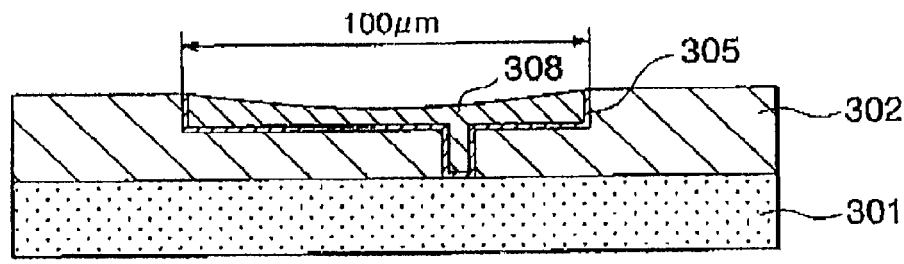
FIG. 12 is a sectional view for explaining dishing occurring in polishing of a copper film by CMP.
Figure 13:
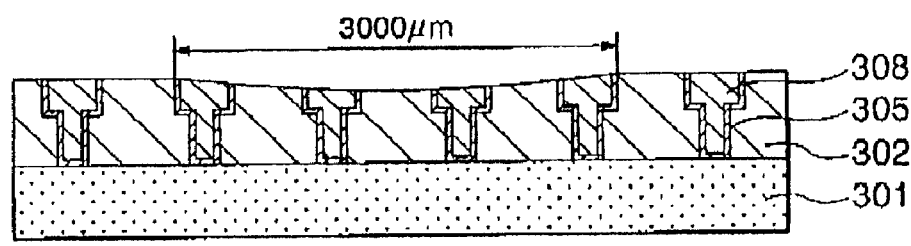
FIG. 13 is a sectional view for explaining erosion occurring in polishing of a copper film by CMP.
Figure 14:
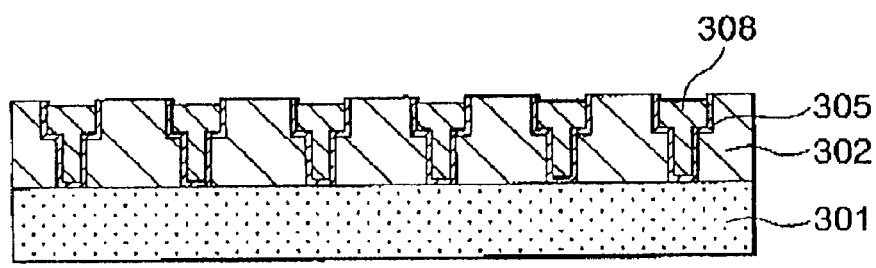
FIG. 14 is a sectional view for explaining a recess occurring in polishing of a copper film by CMP.
Figure 15:
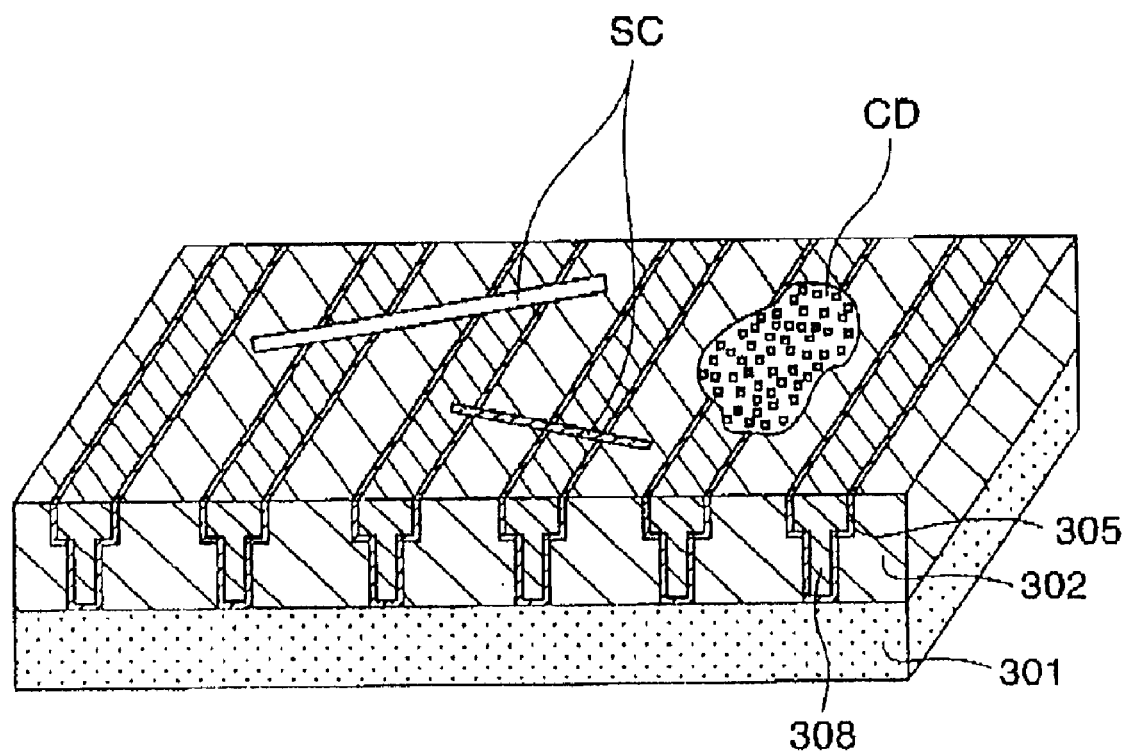
FIG. 15 is a sectional view for explaining a scratch and chemical damage occurring in polishing of a copper film by CMP.

The polishing apparatus of this embodiment is configured to eject the electrolytic solution from a nozzle in the same way as in the third embodiment. FIG. 10 is a schematic view of the configuration of the nozzle portion.

The polishing apparatus of this embodiment is similar to the polishing apparatus of the third embodiment in ejecting the electrolytic solution EL from the nozzle N etc., but differs in that it has a cathode member $E_-$ formed to face the film to be polished of the wafer at part of the hollow circular nozzle N supplying the electrolytic solution, has an anode member $E_+$ formed facing the film to be polished of the wafer set apart from the cathode member $E_-$ by a certain distance, ejects the electrolytic solution EL from the nozzle N so as to interpose the electrolytic solution EL at least between the film of the wafer and the cathode member $E_-$ and between the interconnection layer 105 and the anode member $E_+$, and supplies voltage from the power supply 25 with the cathode member $E_-$ as the cathode and the anode member $E_+$ as the anode.

The nozzle portion between the cathode member $E_-$ and the anode member $E_+$ is comprised of an insulating member.

The rest of the configuration is similar to that of the polishing apparatus of the third embodiment.

At this time, the distance $d_1$ between the film of the wafer and the cathode member $E_-$ and distance $d_2$ between the film and the anode member $E_+$ are set sufficiently small, while the distance $d_3$ between the cathode member $E_-$ and the anode member $E_+$ is set sufficiently large.

Therefore, the sum of the resistance between the film to be polished and the anode member $E_+$, the resistance of the portions of the film facing the cathode member $E_-$ and the anode member $E_+$ respectively, and the resistance between the film and the cathode member $E_-$ is smaller than the direct resistance between the anode member $E_+$ and the cathode member $E_-$, and the current I from the anode member $E_+$ to the cathode member $E_-$ flows through the film, so the same effect is obtained as when applying voltage with the cathode member $E_-$ as a cathode and the film to be polished as an anode.

As a result, as shown in FIG. 10, a chelate film is formed and polished at the surface R of the part of the film to be polished facing the cathode member $E_-$ due to the anodic oxidation reaction and chelation reaction.

If the above anode member can be ionized more easily than the surface to be polished, that is, the copper, the anode member would end up being eluted in the above electrolytic reaction. Therefore, it is preferable to use a metal more precious than copper for the anode member. For example, use can be made of an electrode comprised of platinum or titanium covered by platinum.

If the distance $d_1$ between the cathode member $E_-$ and the wafer W is too short, the action of the flow of the electrolytic solution between the cathode member $E_-$ and the wafer W becomes insufficient. Therefore it is preferably set to above a certain value.

If the distance $d_2$ between the anode member $E_+$ and the wafer W is too short, the action of the flow of the electrolytic solution between the anode member $E_+$ and the wafer W becomes insufficient. Therefore it is preferably set to above a certain value.

If the distance $d_3$ between the cathode member $E_-$ and the anode member $E_+$ is too short, a direct current will flow through the electrolytic solution interposed between the cathode member $E_-$ and the anode member $E_+$ without going through the wafer and the electrolytic action on the surface of the wafer will become insufficient. Therefore, it is preferably set to a sufficiently larger value compared with the distance $d_1$ between the cathode member $E_-$ and the wafer W and the distance $d_2$ between the anode member $E_+$ and the wafer W.

Specifically, when using for example quinaldinic acid as an electrolytic solution, making the distance $d_1$ between the cathode member $E_-$ and the wafer W and the distance $d_2$ between the anode member $E_+$ and the wafer W 2 mm, respectively, and supplying voltage of about 100V between the cathode member $E_-$ and the anode member $E_+$, the distance $d_3$ between the cathode member $E_-$ and the anode member $E_+$ is made at least 40 mm.

In the polishing apparatus of the above embodiment and the polishing method using the same, in the same way as the third embodiment, when anodically oxidizing the surface of the film and chelating the film by the chelating agent, the electrolytic solution is made to flow over the surface to be polished substantially parallel to the surface. Due to this, the chelate film is removed by the action of the shear stress due to the electrolytic solution, the initial unevenness can be easily flattened, and the film can be efficiently polished while maintaining flatness.

Further, since strong pressure is not applied to the surface as with chemical mechanical polishing, the film can be polished while suppressing damage to the interlayer insulating film under the film being polished.

Still further, since the polishing apparatus of this embodiment is simple in configuration, it can be easily reduced in size, is easy to maintain, and enables an improvement in the operating efficiency.

Further, since the edge of the wafer is not used for connection of the anode, it is possible to polish the enter surface flat, up to even the edge, without contact.

The present invention is not limited to the above embodiments.

For example, in the above embodiments, use was made of an anodic oxidation reaction caused by the supply of voltage in an electrolytic solution, but it is also possible to cause oxidation by an oxidizing agent such as hydrogen peroxide added to the electrolytic solution instead of the anodic oxidation. In this case, supply of voltage becomes unnecessary.

Further, in the above embodiments, the film to be polished was chelated to convert it to a chelate film with a weak mechanical strength, then removed, but by supplying an etching solution or chemical polishing agent containing a polishing abrasive over the surface of the film instead of the electrolytic solution, it is possible to flatten the film by the shear force of the etching solution or chemical polishing agent containing a polishing abrasive without the formation of a chelate.

Further, by arranging the electrodes as in the above embodiments and supplying voltage to cause electrolytic elution and supplying an electrolytic solution over the surface of the film to be polished at that time, it is possible to promote electrolytic elution for flattening the surface.

Further, the type of the chelating agent and materials of the cathode or the anode member etc. are not specifically limited.

Furthermore, the present invention can be applied to a polishing method or polishing apparatus for copper film etc. in a process other than for fabrication of a semiconductor device.

In addition, the present invention is not limited to fabrication of semiconductor devices as in the above embodiments. By suitable modification, it is applicable to fabrication of contact holes, interconnection grooves, or a barrier metal layer or other processes than the process of flattening a copper film.

Numerous other modifications can also be made without departing from the basic concept and scope of the invention.

Summarizing the effects of the present invention, according to the polishing method of the present invention, when flattening a copper film or other film by polishing to form copper interconnections in a semiconductor device, it is possible to easily flatten the initial unevenness by the action of the shear stress of the electrolytic solution and possible to polish the film efficiently while maintaining flatness. Further, since no strong pressure is applied to the surface as in chemical mechanical polishing, polishing is possible while suppressing damage to the interlayer insulating film etc. under the film being polished.

According to the polishing apparatus of the present invention, when flattening a copper film or other film by polishing by the polishing method of the present invention, it is possible to easily flatten the initial unevenness by the action of the shear stress of the electrolytic solution and possible to polish the film efficiently while maintaining flatness. Further, since no strong pressure is applied to the surface as in chemical mechanical polishing, polishing is possible while suppressing damage to the interlayer insulating film etc. under the film being polished.

While the invention has been described with reference to specific embodiments chosen for purpose of illustration, it should be apparent that numerous modifications could be made thereto by those skilled in the art without departing from the basic concept and scope of the invention.

What is claimed is:

1. A polishing method for polishing a film of an object to be polished having a substrate, an insulating film formed over the substrate, interconnection grooves formed in the insulating film, and an interconnection layer film, formed inside and outside of the interconnection grooves comprising:

supplying a processing solution over the surface to be polished at least substantially parallel to that surface and removing by polishing the interconnection film formed outside of the interconnection grooves by a shear stress due to the processing solution;

wherein the object to be polished is an object having contact holes communicating with the interconnection grooves formed in the insulating film and having portions of an interconnection layer formed buried inside the contact holes as well;

using a processing solution containing at least a chelating agent as the processing solution;

chelating the surface part of the film by the chelating agent to form a chelate film;

removing by polishing preferentially projecting portions of the chelate film by the shear stress of the processing solution; and repeatedly again forming a chelate film on the surface parts of the film exposed at the projecting portions and removing by polishing preferentially the projecting portions of the chelate film to flatten the film.

2. A polishing method for polishing a film applied to an object having an insulating film formed over a substrate, interconnection grooves formed in the insulating film, said film located inside said grooves and above said insulating film, said method comprising:

supplying a processing solution over the surface to be polished at least substantially parallel to that surface and removing by polishing projecting portions of film formed outside of the interconnection grooves by a shear stress due to the application of the processing solution wherein said processing solution contains at least a chelating agent;

chelating the surface part of the film by the chelating agent to form a chelate film;

removing projecting portions of the chelate film by the shear stress of the application of the processing solution; and repeatedly forming a chelate film on the surface parts of the film exposed at the projecting portions and removing by polishing the projecting portions of the chelate film to flatten the film.

3. A polishing method as set forth in claim 2, further comprising using a polishing solution further including an oxidizing agent as said polishing solution and oxidizing the surface part of the film by said oxidizing agent and chelating the obtained oxide by said chelating agent to form a chelate film.

4. A polishing method as set forth in claim 2, further comprising using a polishing solution further including a surface-active agent as said polishing solution and removing said chelate as micelles covered by said surface-active agent when removing by polishing projecting portions of said chelate film by the shear stress by said processing solution.

5. A polishing method as set forth in claim 2, further comprising:

supplying an electrolytic solution at least between said surface to be polished and a cathode member arranged facing said surface and substantially parallel to said surface while supplying voltage with the cathode member as a cathode and said film as an anode to remove projecting portions of said film by the shear stress of the applied electrolytic solution to flatten the surface.

6. A polishing method as set forth in claim 5, wherein the film comprises a copper film.

7. A polishing method as set forth in claim 5, further comprising using as the object to be polished an object having a substrate, an insulating film formed over said substrate, interconnection grooves formed in the insulating film, and an interconnection layer buried inside the interconnection grooves and formed over the surface outside the interconnection grooves, and removing by polishing the interconnection layer, formed outside of the interconnection grooves to flatten the surface.

8. A polishing method as set forth in claim 7, wherein the object to be polished is an object having contact holes communicating with the interconnection grooves formed in the insulating film and having an interconnection layer formed inside the contact holes.

9. A polishing method for an object having a film on a surface to be polished, comprising:

supplying an electrolytic solution at least between said surface to be polished and a cathode member arranged facing said surface and substantially parallel to said surface while supplying voltage with the cathode member as a cathode and said film as an anode to remove by projecting portions of said film by the shear stress of the applied electrolytic solution to flatten the surface, said method further comprising:

using an electrolytic solution containing at least a chelating agent as the electrolytic solution;

supplying a voltage with said cathode member as a cathode and said film as an anode to oxidize the surface of the film by anodic oxidation;

chelating the surface part of the oxidized film by the chelating agent to form a chelate film;

removing projecting portions of the chelate film by the shear stress of the application of the electrolytic solution; and repeatedly forming a chelate film on the surface parts of the film exposed at the projecting portions and removing by polishing the projecting portions of the chelate film to flatten an interconnection layer.

10. A polishing method as set forth in claim 9, further comprising using an electrolytic solution further including a surface-active agent as said electrolytic solution and removing said chelate as micelles covered by said surface-active agent when removing by polishing projecting portions of said chelate film by the shear stress by said electrolytic solution.

11. A polishing method as set forth in claim 9, wherein the object to be polished is an object having contact holes communicating with the interconnection grooves formed in the insulating film and having an interconnection layer formed buried inside the contact holes as well.

12. A polishing method as set forth in claim 9, wherein the film comprises a copper film.

13. A polishing method as set forth in claim 9, further comprising using as the object to be polished an object having a substrate, an insulating film formed over said substrate, interconnection grooves formed in the insulating film, and said film formed inside said grooves and above said insulating film, said method comprising:

removing by polishing the film portion formed outside of the interconnection grooves to flatten the surface.

14. A polishing method as set forth in claim 9, wherein the object to be polished further has contact holes communicating with the interconnection grooves formed in the insulating film and having the interconnection layer formed buried inside the contact holes as well.

* * * * *